(12) United States Patent
Malvar et al.

(10) Patent No.: US 7,167,568 B2
(45) Date of Patent: Jan. 23, 2007

(54) MICROPHONE ARRAY SIGNAL ENHANCEMENT

(75) Inventors: Henrique S. Malvar, Sammamish, WA (US); Dinei Afonso Ferreira Florencio, Redmond, WA (US); Bradford W. Gillespie, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 883 days.

(21) Appl. No.: 10/138,005

(22) Filed: May 2, 2002

(65) Prior Publication Data

US 2003/0206640 A1 Nov. 6, 2003

(51) Int. Cl.
*H04B 3/20* (2006.01)
*G06F 17/10* (2006.01)
*H04M 9/08* (2006.01)

(52) U.S. Cl. .................... 381/66; 708/322; 379/406.01; 379/406.08

(58) Field of Classification Search ................. 708/322; 381/66; 379/406.4, 406.8
See application file for complete search history.

(56) References Cited

U.S. PATENT DOCUMENTS 5,483,594 A * 1/1996 Prado et al. ........... 379/406.08
5,548,642 A * 8/1996 Diethorn ................ 379/406.14
5,706,402 A * 1/1998 Bell ............................ 706/22
6,317,703 B1 11/2001 Linsker

OTHER PUBLICATIONS

"5.3 Linear Prediction Analysis"; http://www.ims.uni-stuttgart.de/phonetik/marcus/HTKbook/node50.html, Viewed Jun. 25, 2002, p. 1-3.

"Linear Prediction Analysis"; http://svr-www.eng.cam.ac.uk/~ajr/SA95/node38.html, Viewed Jun. 25, 2002, p. 1.

"Speech Dereverberation and Noise Reduction with a Combined Microphone Array Approach"; J. Gonzalez-Rodriguez, et al; 2000 IEEE; pp. 1037-1040.

"A Signal Subspace Tracking Algorithm for Microphone Array Processing of Speech"; Sofiene Affes, et al.; IEEE Transactions on Speech and Audio Processing; vol. 5, No. 5, Sep. 1997; pp. 425-437.

"Computer-Steered Microphone Arrays for Sound Transduction in Large Rooms"; J. L. Flanagan, et al.; 1985 Acoustical Society of America; pp. 1508-1518.

(Continued)

*Primary Examiner*—Vivian Chin
*Assistant Examiner*—Douglas Suthers
(74) *Attorney, Agent, or Firm*—Amin, Turocy, & Calvin, LLP

(57) ABSTRACT

A system and method facilitating signal enhancement utilizing an adaptive filter is provided. The invention includes an adaptive filter that filters an input based upon a plurality of adaptive coefficients and modifies the adaptive coefficients based on a feedback output. A feedback component provides the feedback output based, at least in part, upon a non-linear function of the acoustic reverberation reduced output. Optionally, the system can further include a linear prediction (LP) analyzer and/or a LP synthesis filter. The system can enhance signal(s), for example, to improve the quality of speech that is acquired by a microphone by reducing reverberation. The system utilizes, at least in part, the principle that certain characteristics of reverberated speech are measurably different from corresponding characteristics of clean speech. The system can employ a filter technology (e.g. reverberation reducing) based on a non-linear function, for example, the kurtosis metric.

49 Claims, 15 Drawing Sheets

OTHER PUBLICATIONS

"Speech Enhancement Based on the Subspace Method"; IEEE Transactions on Speech and Audio Processing, vol. 8, No. 5., Sep. 2000; pp. 497-507.

"On the Use of Explicit Speech Modeling in Microphone Array Applications"; Michael S. Brandstein, et al.; 1998 IEEE; Harvard University; pp. 3613-1616.

Theoretical Noise Reduction Limits of the Generalized Sidelobe Canceller (GSC) for Speech Enhancement; Joerg Bitzer, et al.; 1999 IIIE, University of Bremen, pp. 2965-2968.

"Enhancement of Reverberant Speech Using LP Residual Signal"; B. Yegnanarayana, et al.; IEEE Transactions on Speech and Audio Processing, vol. 8, No. 3, May 2000; pp. 267-281.

"Performance of Some Sparseness Criterion Blind Deconvolution Methods in the Presence of Noise"; Michael K. Broadband, et al.; J. Acoust. Soc. Am. 107 (2), Feb. 2000; pp. 885-893.

"Convolutive Blind Separation of Non-Stationary Sources"; Lucas Parra, et al.; IEEE Transactions Speech and Audio Processing, vol. XX, No. Y, Month 1999; pp. 1-9.

"Adaptive Microphone Arrray Employing Calibration Signals. An Analytical Evaluation."; Sven Nordholm, et al.; May 26, 1998; pp. 1-33.

"Robustness of SVD-Based Optimal Filtering for Noise Reduction in Multi-Microphone Speech Signals"; Simon Doclo, et al.; Published in Proc. of the 1999 IEEE International Workshop on Acoustic Echo and Noise Control (IWAENC'99), Pocono Manor, PA, Sep. 27-30, 1999, pp. 80-83.

"An Approach of Dereverberation Using Multi-Microphone Sub-Band Envelope Estimation"; Hong Wang, et al.; 1991 IEEE; pp. 953-956.

"A Modulated Complex Lapped Transform and its Applications to Audio Processing"; Henrique Malvar; May 1999; pp. 1-9.

"Adaptive Noise Reduction of Speech Signals"; Wejqing Jiang, et al.; Technical Report MSR-TR-2000-86; Jul. 2000; pp. 1-9.

"A Modulated Complex Lapped Transform and its Applications to Audio Processing"; Henrique Malvar; Presented at IEEE ICASSP'99-Phoenix, Arizona, Mar. 1999; pp. 1-4.

"Speech Dereverberation Via Maximum-Kurtosis Subband Adaptive Filtering"; Bradford W. Gillespie, et al.; Microsoft Research.

Ralph A. Wiggins, Minimum Entropy Deconvolution, Geoexploration, 1978, pp. 21-35, vol. 16.

Simon Haykin, Adaptive Filter Theory, 1996, 989 pages, Prentice-Hall.

O. Tanrikulu and A.G. Constantinides, Least-Mean Kurtosis: A Novel Higher-Order Statistics Based Adaptive Filtering Algorithm, Electronic Letters, Feb. 3, 1994, pp. 189-190, vol. 30, No. 3.

Lloyd J. Griffiths and Charles W. Jim, An Alternative Approach to Linearly Constrained Adaptive Beamforming, IEEE Transactions on Antennas and Propagation, Jan. 1982, pp. 27-34, vol. AP-30.

Dinei A. Florencio and Henrique S. Malvar, Multichannel Filtering for Optimum Noise Reduction in Microphone Arrays, Proceedings of the IEEE International Conference on Acoustics, Speech, and Signal Processing, May 2001, pp. 197-200.

* cited by examiner

MICROPHONE ARRAY SIGNAL ENHANCEMENT

TECHNICAL FIELD

The present invention relates generally to acoustic signal enhancement, and more particularly to a system and method facilitating signal enhancement utilizing an adaptive filter.

BACKGROUND OF THE INVENTION

The quality of speech captured by personal computers can be degraded by environmental noise and/or by reverberation (e.g., caused by the sound waves reflecting off walls and other surfaces). Quasi-stationary noise produced by computer fans and air conditioning can be significantly reduced by spectral subtraction or similar techniques. In contrast, removing non-stationary noise and/or reducing the distortion caused by reverberation are much harder problems. De-reverberation is a difficult blind deconvolution problem due to the broadband nature of speech and the high order of the equivalent impulse response from the speaker's mouth to the microphone. The problem is, of course, alleviated by the use of microphone headsets, but those are usually inconvenient to the user.

Using signal processing to improve the quality of speech acquired by microphone(s) has been a long-standing interest in the Digital Signal Processing community, with some of the most promising technologies being based on microphone arrays. The microphone array literature is particularly populated with algorithms based on the Generalized Sidelobe Canceller (GSC), but performance degrades quickly with reverberation. Other algorithms are based on optimum filtering concepts, or signal subspace projection. A different approach comes from Blind Source Separation (BSS). Curiously, while BSS techniques perform extremely well in some environments, they tend to be overly sensitive to ambient conditions (e.g., room reverberation), and perform poorly in most real-world scenarios.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for a signal enhancement system reducing reverberation and/or noise in an input signal. According to an aspect of the present invention, an audio enhancement system (e.g., acoustic reverberation reduction) having an adaptive filter and a feedback component is provided. Optionally, the system can further include a linear prediction (LP) analyzer and/or a LP synthesis filter.

The system can enhance signal(s), for example, to improve the quality of speech that is acquired by a microphone by reducing reverberation. The system utilizes, at least in part, the principle that certain characteristics of reverberated speech are measurably different from corresponding characteristics of clean speech. The system can employ a filter technology (e.g., reverberation reducing) based on a non-linear function, for example, the kurtosis metric.

The adaptive filter filters an input signal based, at least in part, upon a plurality of adaptive coefficients. The adaptive filter modifies at least one of the plurality of adaptive coefficients based, at least in part, upon a feedback output of the feedback component. The adaptive filter provides a quality enhanced (e.g., acoustic reverberation reduced) output.

The adaptive filter employs a filter technology (e.g., reverberation measuring) based on a non-linear function, for example, the kurtosis metric. The feedback component provides the feedback output which is used by the adaptive filter to control filter updates. The feedback output can be based, at least in part, upon a non-linear function of the quality enhanced (e.g., acoustic reverberation reduced) output of the adaptive filter.

The LP analyzer analyzes the input signal and provides the LP residual output. The LP analyzer can be a filter constrained to be an all-pole linear filter that performs a linear prediction of the next sample as a weighted sum of past samples.

The LP synthesis filter filters the acoustic reverberation output from the adaptive filter and provides a processed output signal. The LP synthesis filter can perform the inverse function of the LP analyzer.

Another aspect of the present invention provides for an audio enhancement system (e.g., acoustic reverberation reduction) system having a first adaptive filter, an LP analyzer, a second adaptive filter and a feedback component.

The first adaptive filter filters an input signal based, at least in part, upon a plurality of adaptive coefficients. The first adaptive filter provides a quality enhanced (e.g., acoustic reverberation reduced) output. This filter is adaptive, but in the sense that the coefficients will vary with the signal. In fact, the coefficients of this first adaptive filter are copied (e.g., periodically) from the second adaptive filter. The second filter is the one that actually drives the adaptation process.

The LP analyzer analyzes the input signal and provides a linear prediction residual output. The LP analyzer can be a filter constrained to be an all-pole linear filter that performs a linear prediction of the next sample as a weighted sum of past samples.

The second adaptive filter filters the linear prediction output received from the LP analyzer based, at least in part, upon the plurality of adaptive coefficients. The second adaptive filter is adapted to modify at least one of the plurality of adaptive coefficients based, at least in part, upon a feedback output from the feedback component.

The second adaptive filter employs a filter technology (e.g., reverberation measuring) based on a non-linear function, for example, the kurtosis metric. The second adaptive filter further provides an output to the feedback component.

The feedback component provides the feedback output which is used by the second adaptive filter to control filter updates. The feedback output can be based, at least in part, upon a non-linear function of the output of the second adaptive filter.

An aspect of the present invention provides for the audio enhancement system to be extended to a multi-channel implementation.

Yet another aspect of the present invention provides for a frequency domain audio enhancement (e.g., reverberation reduction) system having a first adaptive filter, an LP analyzer, a second adaptive filter and a feedback component.

The system uses a subband adaptive filtering structure based, for example, on the modulated complex lapped transform (MCLT). Since the subband signal has an approximately flat spectrum, faster convergence and/or reduced sensitivity to noise, for example, can be achieved.

The first adaptive filter includes a frequency transform, a plurality of adaptive coefficients and an inverse frequency transform. The frequency transform performs a frequency domain transform of an input signal. In one example, the frequency transform employs an MCLT that decomposes the input signal into M complex subbands. However, it is to be appreciated that any suitable frequency domain transform can be employed by the frequency transform in accordance with the present invention.

The plurality of adaptive coefficients are used by the first adaptive filter to filter the input signal. The inverse frequency transform performs an inverse frequency domain transform of the filtered frequency transformed input signal. For example, the inverse frequency transform can perform an inverse MCLT.

The LP analyzer analyzes the input signal and provides a linear prediction residual output. The LP analyzer can be a filter constrained to be an all-pole linear filter that performs a linear prediction of the next sample as a weighted sum of past samples.

The second adaptive filter includes a frequency transform, a plurality of adaptive coefficients and an inverse frequency transform. The frequency transform performs a frequency domain transform of the linear prediction output. The second adaptive filter filters the frequency domain transformed linear prediction output based, at least in part, upon the plurality of adaptive coefficients. The second adaptive filter modifies at least one of the plurality of adaptive coefficients based, at least in part, upon a feedback output from the feedback component. The second adaptive filter further provides an output.

The feedback component provides the feedback output based, at least in part, upon a non-linear function of the output of the second adaptive filter. Also provided is a multi-channel audio enhancement (e.g., acoustic reverberation reduction) system in accordance with an aspect of the present invention.

Another aspect of the present invention provides for a noise reduction system having a first statistics component, a second statistics component and a spatial filter. Optionally, the system can include a voice activity detector.

The first (e.g., noise) statistics component stores statistics associated with a first portion or type of an input signal (e.g., noise statistics associated with a noise portion of an input signal). The second (e.g., signal+noise) statistics component stores statistics associated with a second portion or type of an input signal (e.g., signal+noise statistics associated with a signal and noise portion of the input signal). The spatial filter provides an output signal, the output signal being based, at least in part, upon a filtered input signal, the filtering being based, at least in part, upon a weighted error calculation of the first statistics (e.g., noise statistics) and the second statistics (e.g., signal+noise statistics). The spatial filter can be a fixed filter or an adaptive filter.

The voice activity detector provides information to the first statistic component and/or the second statistics component based, at least in part, upon the output signal of the spatial filter. The voice activity detector detects when substantially only noise is present (e.g., silent period(s)) and provides the input signal, for example, to the first statistics component. When speech is present, possibly with noise, the input signal can be provided to the second statistics component by the voice activity detector.

The spatial filter can utilize an improved Wiener filter based, at least in part, upon a weighted error calculation of the first statistics (e.g., noise) and the second statistics (e.g., signal+noise).

Yet another aspect of the present invention provides for a Least Means Squared (LMS)-based noise reduction system having a signal+noise buffer, a noise buffer, a signal composer, a filter, an LMS filter and differential component.

A synthetic input signal and its associated desired signal are generated by the signal composer by adding data from the signal+noise buffer and/or the noise buffer to the input data. This synthetic signal is used to adapt the LMS filter. The filter coefficients are copied (e.g., continuously) to the filter, which directly processes the input signal.

Another aspect of the present invention provides for a signal enhancement system having a frequency transform, a voice activity detector, a noise buffer, a signal+noise buffer, a filter, a noise adaptive filter, a reverberation adaptive filter, an inverse frequency transform, a noise feedback component and a reverberation feedback component.

The voice activity detector provides information to the noise buffer and/or the signal+noise buffer based, at least in part, upon the input signal. The voice activity detector detects when substantially only noise is present (e.g., silent period(s)) and provides the input signal to the noise buffer. When speech is present, possibly with noise, the input signal can be provided to the noise+signal buffer by the voice activity detector. In one example, the voice activity discards sample(s) of the input signal which it is unable to classify as noise or "signal+noise".

The signals stored in the noise buffer are used to train the noise adaptive filter while the signal stored in the noise+ signal buffer are used train the reverberation adaptive filter.

The filter filters the frequency transform input signal received from the frequency transform based, at least in part, upon a plurality of adaptive coefficients. The filter provides a filtered output to the inverse frequency transform that performs an inverse frequency transform (e.g., inverse MCLT) and provides an acoustic enhancement signal output. The plurality of adaptive coefficients utilized by the filter are modified by the noise adaptive filter and/or the reverberation adaptive filter.

The noise adaptive filter filters the signals stored in the noise buffer based, at least in part, upon the plurality of adaptive coefficients. The noise adaptive filter is adapted to modify at least one of the plurality of adaptive coefficients based, at least in part, upon a feedback output from the noise feedback component.

The noise adaptive filter can employ the improved Wiener filter technique(s) described herein. The noise adaptive filter further provides an output to the noise feedback component.

The noise feedback component provides the noise reduction feedback output based, at least in part, upon a weighted error calculation of the output of the noise reduction adaptive filter.

The reverberation adaptive filter filters the signals stored in the noise+signal buffer based, at least in part, upon the plurality of adaptive coefficients. The reverberation adaptive filter is adapted to modify at least one of the plurality of adaptive coefficients based, at least in part, upon a feedback output from the reverberation feedback component.

The reverberation adaptive filter employs a reverberation measuring filter technology based on a non-linear function, for example, the kurtosis metric. The reverberation adaptive filter further provides an output to the reverberation feedback component.

The reverberation feedback component provides the feedback output which is used by the reverberation adaptive filter to control filter updates. The feedback output can be based, at least in part, upon a non-linear function of the output of the reverberation adaptive filter.

Other aspects of the present invention provide methods for reducing acoustic reverberation, reducing acoustic noise, and enhancing an acoustic signal. Further provided are a computer readable medium having computer usable instructions for a system for facilitating acoustic reverberation reduction and a computer readable medium having computer usable instructions for a system for acoustic noise reduction. A data packet adapted to be transmitted between two or more computer components that facilitates acoustic reverberation reduction, the data packet comprising a data field comprising a plurality of adaptive coefficients, at least one of the plurality of adaptive coefficients having been modified based, at least in part, upon a feedback output based, at least in part, upon a non-linear function of an acoustic reverberation reduced output is provided. Also provided is a data packet adapted to be transmitted between two or more computer components that facilitates acoustic noise reduction, the data packet comprising a data field comprising a plurality of adaptive coefficients, at least one of the plurality of adaptive coefficients having been modified based, at least in part, upon a feedback output based, at least in part, upon a weighted error calculation of noise statistics and signal+ noise statistics.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention may become apparent from the following detailed description of the invention when considered in conjunction with the drawings.

DETAILED DESCRIPTION OF THE INVENTION

Figure 1:
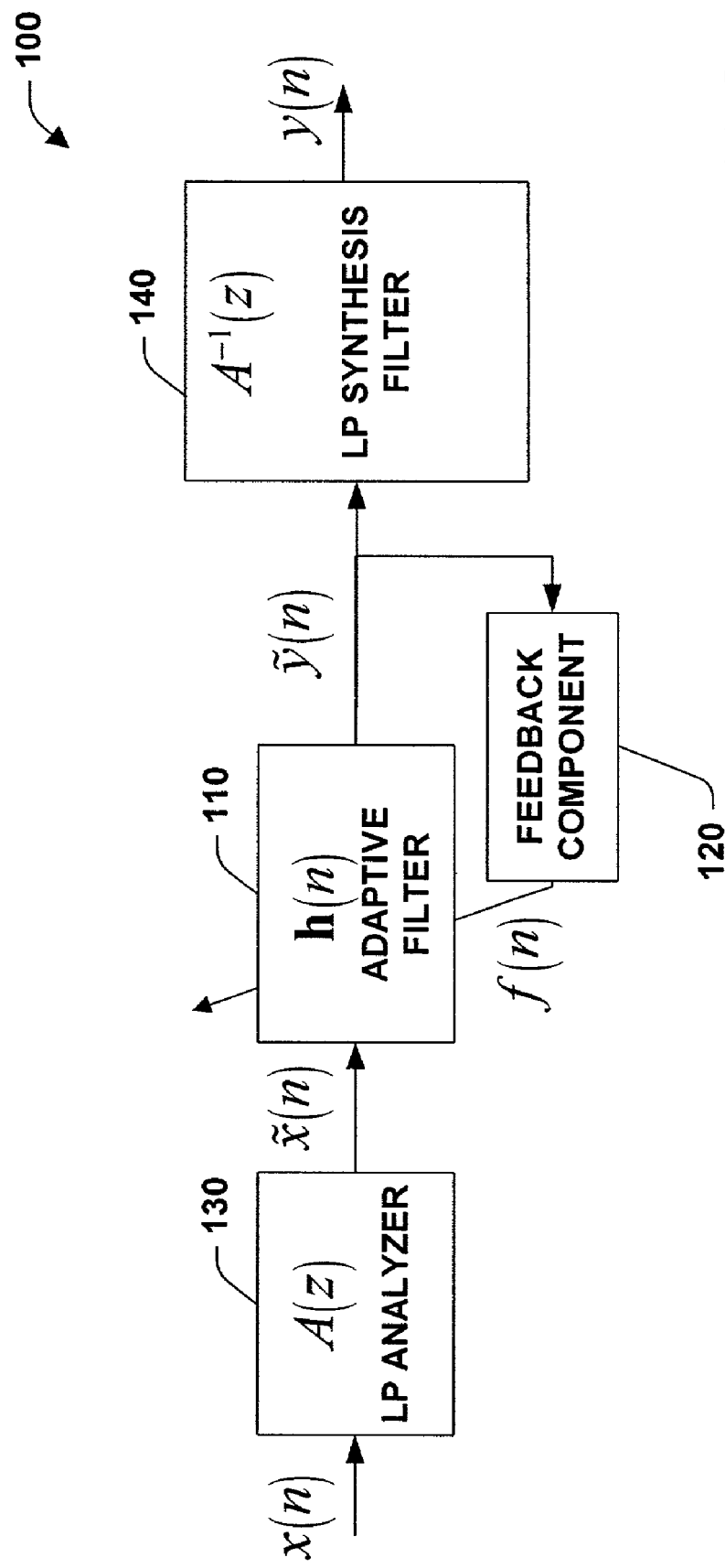
FIG. 1 is a block diagram of an audio enhancement system in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the term "computer component" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers.

Referring to FIG. 1, an audio enhancement system 100 in accordance with an aspect of the present invention is illustrated. The system 100 includes an adaptive filter 110 and a feedback component 120. Optionally, the system 100 can further include a linear prediction analyzer 130 (LP prediction analyzer 130) and/or a linear prediction synthesis filter 140 (LP synthesis filter 140).

The system 100 can enhance signal(s), for example to improve the quality of speech that is acquired by a microphone (not shown) by reducing reverberation. The system 100 utilizes, at least in part, the principle that certain characteristics of reverberated speech are different from those of clean speech. The system 100 can employ a filter technology (e.g., reverberation measuring) based on a non-linear function, for example, the kurtosis metric. In one example, the non-linear function is based on increasing a non-linear measure of speechness (e.g., based on maximizing kurtosis of an LPC residual of an output signal).

It has been observed that the kurtosis of the linear prediction (LP) analysis residual of speech reduces with reverberation. In one example, the system 100 utilizes a reverberation-reducing algorithm facilitating an adaptive gradient-descent algorithm that maximizes LP residual kurtosis. In other words, the system 100 facilitates identifying blind deconvolution filter(s) that make the LP residuals non-Gaussian. The received noisy reverberated speech signal is x(n) and its corresponding LP residual output (e.g., received from the optional LP analyzer 130) is x̃(n). The adaptive filter 110 (h(n)) is an L-tap adaptive filter at time n. The output of the adaptive filter 110 is ỹ(n)=h$^T$(n)x̃(n), Where x̃(n)=[x̃(n−L+1) ... x̃(n−1) x̃(n)]$^{-T}$. The optional LP synthesis filter 140 yields y(n), the final processed signal. Adaptation of the adaptive filter 110 (h(n)) is similar to the traditional least means squared (LMS) adaptive filter, except that instead of a desired signal a feedback output from the feedback component 120, f(n) is used.

The adaptive filter 110 filters the LP residual output based, at least in part, upon a plurality of adaptive coefficients. The adaptive filter 110 modifies at least one of the plurality of adaptive coefficients based, at least in part, upon the feedback output of the feedback component 120. The adaptive filter 110 provides a quality enhanced (e.g., acoustic reverberation reduced) output.

The adaptive filter 110 employs a reverberation measuring filter technology based on a non-linear function, for example, the kurtosis metric. In the instance in which the adaptive filter 110 is adapted to maximize the kurtosis of an input signal x̃(n), for example, based, at least in part, upon the following equation:

$$J(n)=E\{\tilde{y}^4(n)\}/E^2\{\tilde{y}^2(n)\}-3 \qquad (1)$$

where the expectations E{ } can be estimated from sample averages. The gradient of J(n) with respect to the current filter is:

$$\frac{\partial J}{\partial h} = \frac{4(E\{\tilde{y}^2\}E\{\tilde{y}^3\tilde{x}\} - E\{\tilde{y}^4\}E\{\tilde{y}\tilde{x}\})}{E^3\{\tilde{y}^2\}} \qquad (2)$$

where the dependence on the time n is not written for simplicity. The gradient can be approximated by:

$$\frac{\partial J}{\partial h} \approx \left(\frac{4((E\{\tilde{y}^2\}\tilde{y}^2 - E\{\tilde{y}^4\})\tilde{y})}{E^3\{\tilde{y}^2\}}\right)\tilde{x} = f(n)\tilde{x}(n) \qquad (3)$$

where f(n) is the feedback output (e.g., function) received from the feedback component 120. For continuous adaptation, E{ỹ$^2$(n)} and E{ỹ$^4$(n)} are estimated recursively. The final structure of the update equations for a filter that maximizes the kurtosis of the LP residual of the input waveform is then given by:

$$h(n+1)=h(n)+\mu f(n)\tilde{x}(n) \qquad (4)$$

where μ controls the speed of adaptation of the adaptive filter 110.

In one example, the non-linear function is based, at least in part, upon selecting a threshold and providing positive feedback for samples above that threshold and negative feedback for samples below that threshold.

The feedback component 120 provides the feedback output f(n) which is used by the adaptive filter 110 to control filter updates. The feedback output can be based, at least in part, upon a non-linear function of the quality enhanced output (e.g., acoustic reverberation reduced) of the adaptive filter 110. For example, the feedback output can be based, at least in part, upon the following equations:

$$f(n) = \frac{4[E\{\tilde{y}^2(n)\}\tilde{y}^2(n) - E\{\tilde{y}^4(n)\}]\tilde{y}(n)}{E^3\{\tilde{y}^2(n)\}}, \qquad (5)$$

$$E\{\tilde{y}^2(n)\} = \beta E\{\tilde{y}^2(n-1)\} + (1-\beta)\tilde{y}^2(n), \text{ and}$$

$$E\{\tilde{y}^4(n)\} = \beta E\{\tilde{y}^4(n-1)\} + (1-\beta)\tilde{y}^4(n).$$

where β controls the smoothness of the moment estimates.

The LP analyzer 130 analyzes an input signal and provides the LP residual output. The LP analyzer 130 can be a filter constrained to be an all-pole linear filter that performs a linear prediction of the next sample as a weighted sum of past samples:

$$\hat{s}_n = \sum_{i=1}^{p} a_i s_{n-1} \qquad (6)$$

Thus, the LP analyzer 130 has the transfer function:

$$A(z) = \frac{1}{1 - \sum_{i=1}^{p} a_i z^{-1}} \qquad (7)$$

The LP analyzer 130 coefficients a, can be chosen to minimize the mean square filter prediction error summed over the analysis window.

The LP synthesis filter 140 filters the acoustic reverberation output from the adaptive filter 110 and provides a processed output signal. The LP synthesis filter 140 can perform the inverse function of the LP analyzer 130.

While FIG. 1 is a block diagram illustrating components for the audio enhancement system 100, it is to be appreciated that the audio enhancement system 100, the adaptive filter 110, the feedback component 120, the LP prediction analyzer 130 and/or the LP synthesis filter 140 can be implemented as one or more computer components, as that term is defined herein. Thus, it is to be appreciated that computer executable components operable to implement the audio enhancement system 100, the adaptive filter 110, the feedback component 120, the LP prediction analyzer 130 and/or the LP synthesis filter 140 can be stored on computer readable media including, but not limited to, an ASIC (application specific integrated circuit), CD (compact disc), DVD (digital video disk), ROM (read only memory), floppy disk, hard disk, EEPROM (electrically erasable programmable read only memory) and memory stick in accordance with the present invention.

Figure 2:
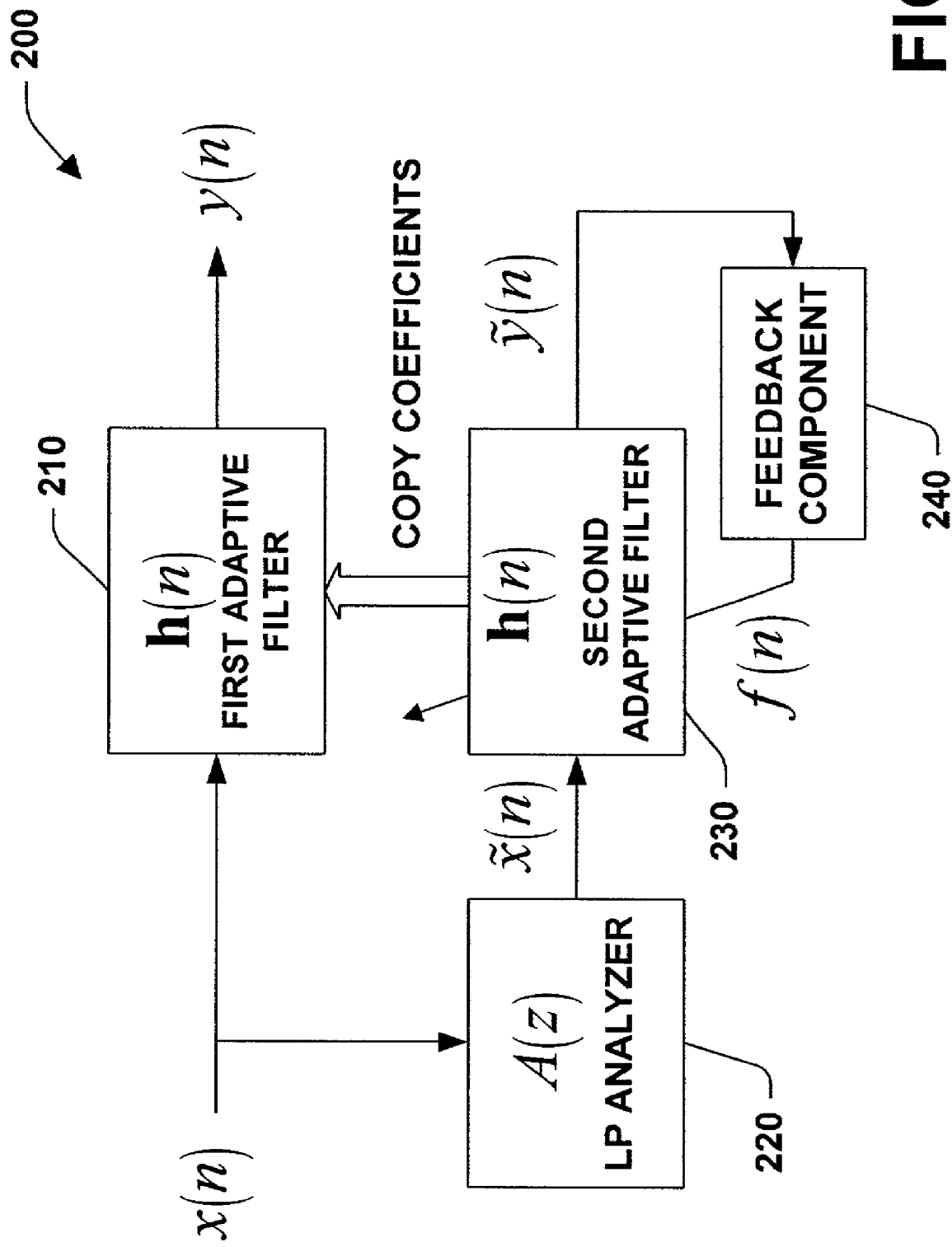
FIG. 2 is a block diagram of an audio enhancement system in accordance with an aspect of the present invention.

Turning to FIG. 2, an audio enhancement system 200 in accordance with an aspect of the present invention is illustrated. For example, LP reconstruction artifacts can be reduced utilizing the system 200 at the small price of running two filters.

The system 200 includes a first adaptive filter 210, an LP analyzer 220, a second adaptive filter 230 and a feedback component 240. It is to be appreciated that the first adaptive filter 210, the LP analyzer 220, the second adaptive filter 230 and/or the feedback component 240 can be implemented as one or more computer components, as that term is defined herein.

The first adaptive filter 210 filters an input signal based, at least in part, upon a plurality of adaptive coefficients. The first adaptive filter 210 provides a quality enhanced output (e.g., acoustic reverberation reduced).

The LP analyzer 220 analyzes the input signal and provides a linear prediction residual output. The LP analyzer 220 can be a filter constrained to be an all-pole linear filter that performs a linear prediction of the next sample as a weighted sum of past samples employing equations (6) and (7) above.

The second adaptive filter 230 filters the linear prediction output received from the LP analyzer 220 based, at least in part, upon the plurality of adaptive coefficients. The second adaptive filter 230 is adapted to modify at least one of the plurality of adaptive coefficients based, at least in part, upon a feedback output from the feedback component 240.

The second adaptive filter 230 can employ a filter technology (e.g., reverberation measuring) based on a non-linear function, for example, the kurtosis metric. In the instance in which the second adaptive filter 230 is adapted to maximize the kurtosis (J(n)) of an input signal $\tilde{x}(n)$, the second adaptive filter 230 can modify the plurality of adaptive coefficients based, at least in part, upon equations (1), (2), (3) and (4) above. The second adaptive filter 230 further provides an output to the feedback component 240.

The feedback component 240 provides the feedback output f(n) which is used by the second adaptive filter 230 to control filter updates. The feedback output can be based, at least in part, upon a non-linear function of the output of the second adaptive filter 230. For example, the feedback output can be based, at least in part, upon the equation (5) above.

A multi-channel time-domain implementation extends directly from the system 200. As before, the objective is to maximize the kurtosis of $\tilde{y}(n)$, the LP residual of y(n). In this case, $$y(n) = \sum_{c=1}^{C} h_c^T(n) x_c(n),$$

where C is the number of channels. Extending the analysis of the system 200, the multi-channel update equations become:

$$h_c(n+1) = h_c(n) + \mu f(n) \tilde{x}_c(n) \quad (8)$$

where the feedback function f(n) is computed as in (5) using the multi-channel y(n). To jointly optimize the filters, each channel can be independently adapted, using substantially the same feedback function.

Direct use of the time-domain LMS-like adaptation described above can, in certain circumstances lead to slow convergence, or no convergence at all under noisy situations, due, at least in part, to large variations in the eigenvectors of the autocorrelation matrices of the input signals. A frequency-domain implementation can reduce this problem.

Figure 3:
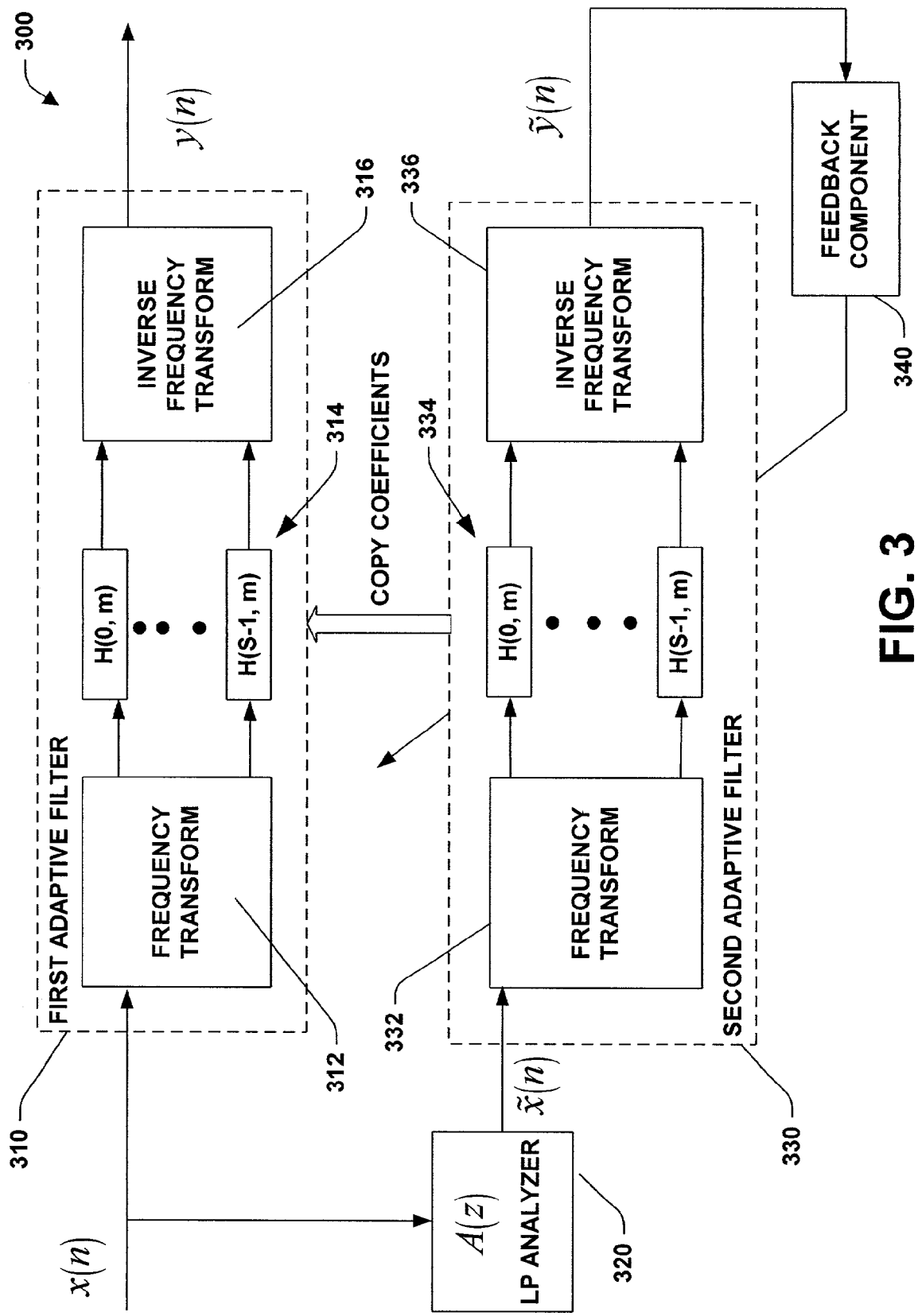
FIG. 3 is a block diagram of a frequency domain audio enhancement system in accordance with an aspect of the present invention.

Referring next to FIG. 3, a frequency domain audio enhancement system 300 in accordance with an aspect of the present invention is illustrated. The system 300 includes a first adaptive filter 310, an LP analyzer 320, a second adaptive filter 330 and a feedback component 340.

The system 300 uses a subband adaptive filtering structure based, for example, on the modulated complex lapped transform (MCLT). Since the subband signal has an approximately flat spectrum, faster convergence and/or reduced sensitivity to noise, for example, can be achieved.

The first adaptive filter 310 includes a frequency transform 312, a plurality of adaptive coefficients 314 and an inverse frequency transform 316. The frequency transform 312 performs a frequency domain transform of an input signal. In one example, the frequency transform 312 employs an MCLT that decomposes the input signal into M complex subbands. However, it is to be appreciated that any suitable frequency domain transform can be employed by the frequency transform 312 in accordance with the present invention.

The plurality of adaptive coefficients 314 are used by the first adaptive filter to filter the input signal. The inverse frequency transform 316 performs an inverse frequency domain transform of the filtered frequency transformed input signal. For example, the inverse frequency transform 316 can perform an inverse MCLT.

The LP analyzer 320 analyzes the input signal and provides a linear prediction residual output. The LP analyzer 320 can be a filter constrained to be an all-pole linear filter that performs a linear prediction of the next sample as a weighted sum of past samples employing equations (6) and (7) above.

The second adaptive filter 330 includes a frequency transform 332, a plurality of adaptive coefficients 334 and an inverse frequency transform 336. The frequency transform 332 performs a frequency domain transform of the linear prediction output. The second adaptive filter 330 filters the frequency domain transformed linear prediction output based, at least in part, upon the plurality of adaptive coefficients 334. The second adaptive filter 330 modifies at least one of the plurality of adaptive coefficients 334 based, at least in part, upon a feedback output from the feedback component 340. The second adaptive filter 334 further provides an output.

In one example, the frequency transform 332 employs an MCLT that decomposes the input signal into M complex subbands. However, it is to be appreciated that any suitable frequency domain transform can be employed by the frequency transform 332 in accordance with the present invention.

In another example, the frequency transform 312 employs an MCLT that decompose the input signal into M complex subbands. To determine M, the tradeoff that larger M are desired to whiten the subband spectra, whereas smaller M are desired to reduce processing delay is considered. For example, a good compromise can be to set M such that the frame length is about 20–40 ms. A subband s of a channel c is processed by a complex FIR adaptive filter with L taps 314, $H_c$ (s,m), where m is the MCLT frame index. By considering that the MCLT approximately satisfies the convolution properties of the FFT, the update equations described above can be mapped to the frequency domain, generating the following update equation:

$$H_c(s, m+1) = H_c(s,m) + \mu F(s,m) \tilde{X}_c^*(s,m) \quad (9)$$

where the superscript * denotes complex conjugation.

The feedback component 340 provides the feedback output based, at least in part, upon a non-linear function of the output of the second adaptive filter 330. Unlike in a standard LMS formulation, the appropriate feedback function F(s, m) cannot be computed in the frequency domain. To compute the MCLT-domain feedback function F(s, m), the reconstructed signal $\tilde{y}(n)$ is generated and f(n) is computed from equation (5). F(s, m) is then computed from f(n), for example, using the MCLT. The overlapping nature of the MCLT introduces a one-frame delay in the computation of F(s, m). Thus, to maintain an appropriate approximation of the gradient, the previous input block is used in the update equation (9), generating the final update equation:

$$H_c(s,m+1)=H_c(s,m)+\mu F(s,m-1)X_c^*(s,m-1). \quad (10)$$

Assuming the learning gain μ is small enough, the extra delay in the update equation above will introduce a very small error in the final convergence of the filter. As before, the updated plurality of adaptive coefficients 334 of the second adaptive filter 330 are then copied to the plurality of adaptive coefficients 314 of the first adaptive filter 310.

It is to be appreciated that the first adaptive filter 310, the LP analyzer 320, the second adaptive filter 330 and/or the feedback component 340 can be implemented as one or more computer components, as that term is defined herein.

Figure 4:
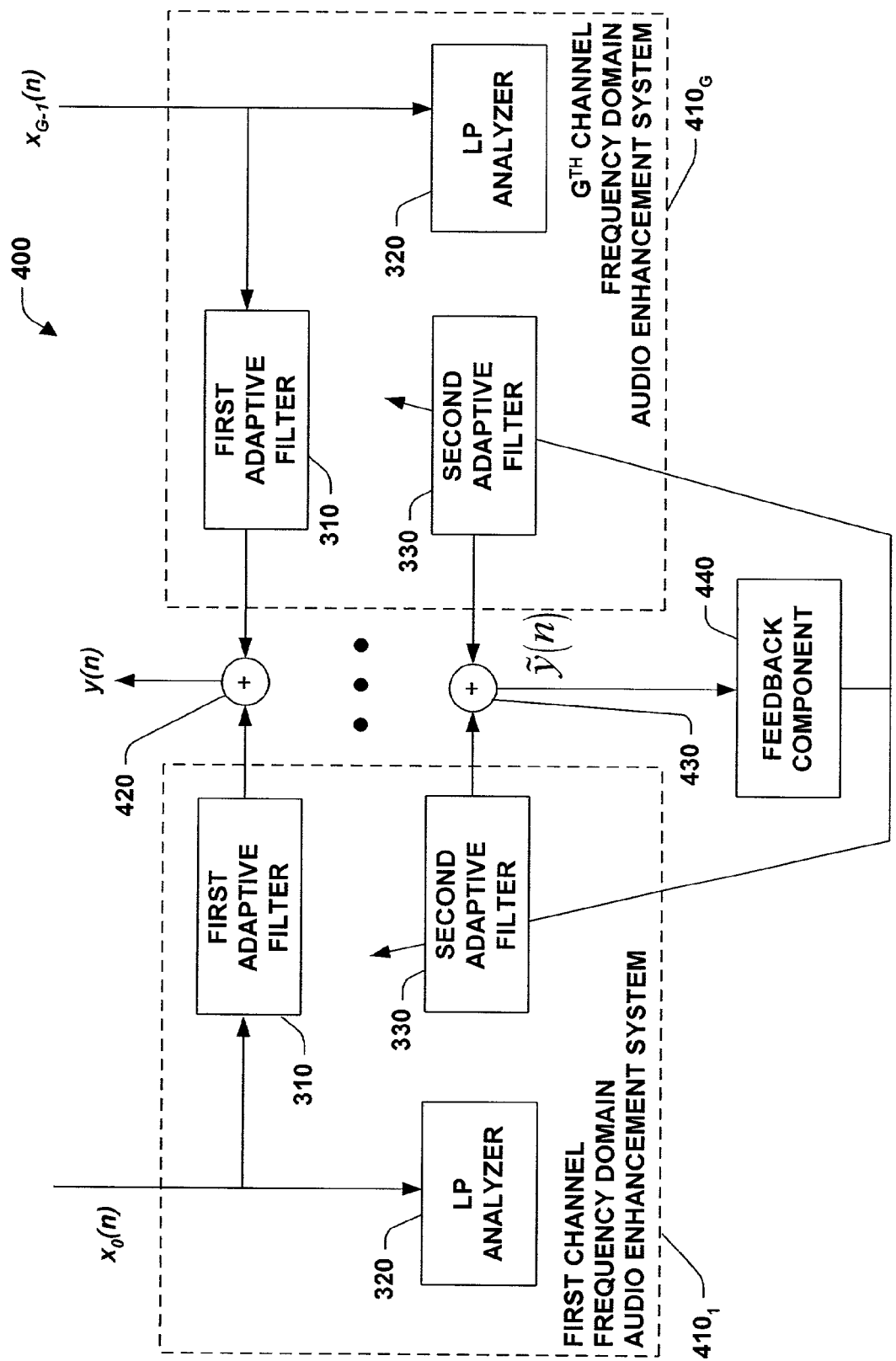
FIG. 4 is a block diagram of a multi-channel audio enhancement system in accordance with an aspect of the present invention.

Turning next to FIG. 4, a multi-channel audio enhancement system 400 in accordance with an aspect of the present invention is illustrated. The system 400 includes a first channel frequency domain audio enhancement system $410_1$ through a Gth channel frequency domain audio enhancement system $410_G$, G being an integer greater to or equal to two. The first channel frequency domain audio enhancement system $410_1$ through the Gth channel frequency domain audio enhancement system $410_G$ can be referred to collectively as the frequency domain audio enhancement systems 410. The system 400 further includes a first summing component 420, a second summing component 430 and a feedback component 440.

The frequency domain audio enhancement systems 410 include a first adaptive filter 310, an LP analyzer 320 and a second adaptive filter 330.

The first summing component 420 sums the outputs of the first adaptive filters 310 of the frequency domain audio enhancement system 410 and provides a reverberation reduced output y(n).

The second summing component 430 sums the outputs of the second adaptive filters 330 of the frequency domain audio enhancement system 410 and provides an output to the feedback component 440.

The feedback component 440 provides a feedback output based, at least in part, upon a non-linear function of the output of the second summing component 430. Operation of the feedback component 440 can be similar to the feedback component 340 above.

It is to be appreciated that the channel frequency domain audio enhancement systems 410, the first summing component 420, the second summing component 430 and/or the feedback component 440 can be implemented as one or more computer components, as that term is defined herein.

Figure 5:
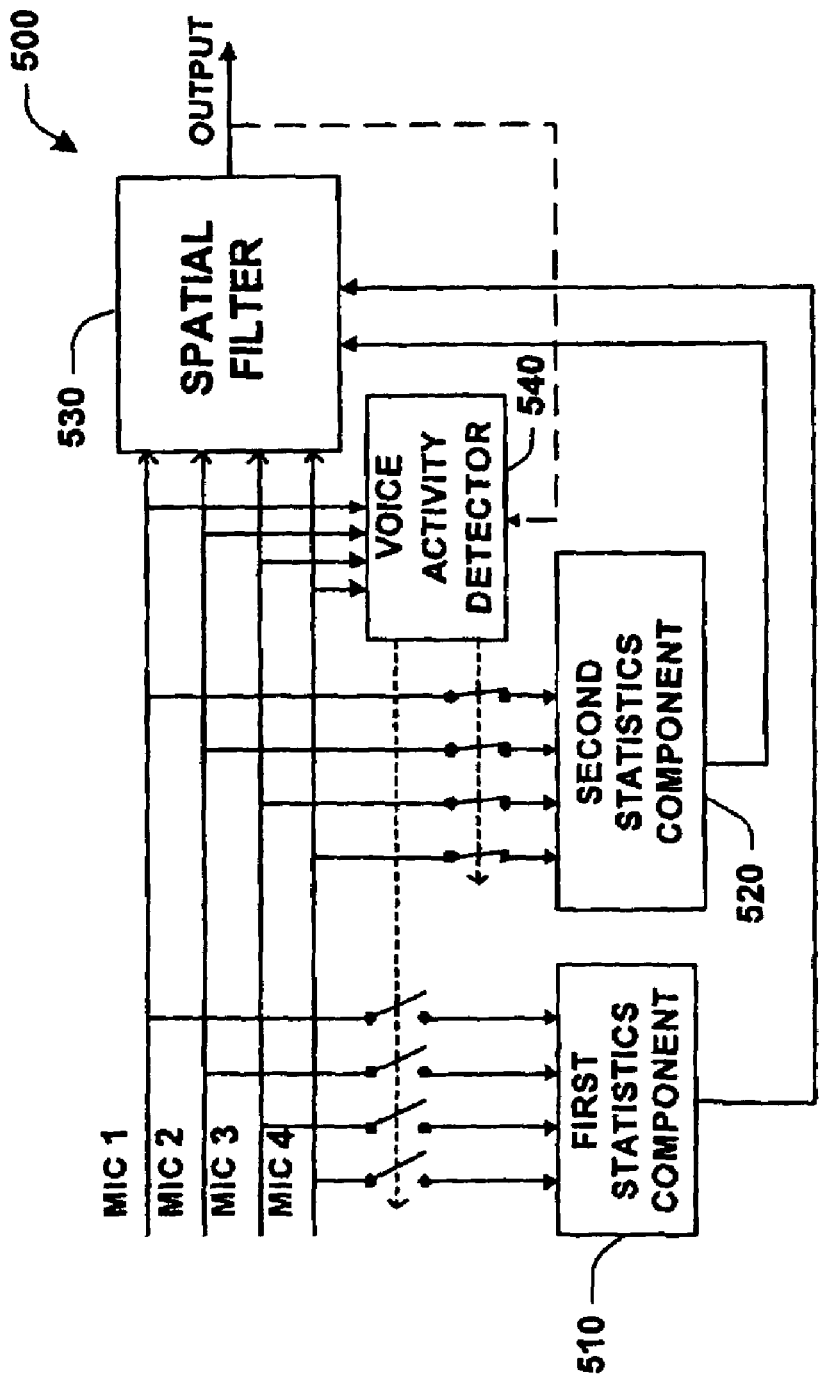
FIG. 5 is a block diagram of an acoustic noise reduction system in accordance with an aspect of the present invention.

Referring next to FIG. 5, a noise reduction system 500 in accordance with an aspect of the present invention is illustrated. The system 500 includes a first statistics component 510, a second statistics component 520 and a spatial filter 530. Optionally, the system 500 can include a voice activity detector 540.

The system 500 receives a plurality of input signals (e.g., from microphones). FIG. 5 includes four input signals (MIC 1, MIC 2, MIC 3 and MIC 4) for purposes of illustration; however, it is to be appreciated that the present invention is not intended to be limited to any specific number of input signals.

The first statistics component 510 stores statistics associated with a first portion or type of an input signal (e.g., noise statistics associated with a noise portion of an input signal). The second statistics component 520 (e.g., second signal statistics component) stores statistics associated with a second portion or type of the input signal (e.g., signal+noise statistics associated with a signal and noise portion of the input signal). The spatial filter 530 provides an output signal, the output signal being based, at least in part, upon a filtered input signal, the filtering being based, at least in part, upon a weighted error calculation of the first statistics (e.g., noise statistics) and the second statistics (e.g., signal+noise statistics). As described below, it is to be appreciated that the spatial filter 530 of the system 500 can be a fixed filter or an adaptive filter.

The voice activity detector 540 provides information to the first statistic component 510 and/or the second statistics component 520 based, at least in part, upon the output signal of the spatial filter 530. The voice activity detector 540 detects when substantially only the first portion or type of the input signal (e.g., noise) is present (e.g., silent period(s)) and provides the input signal to the first statistics component 510. When, for example, speech is present, possibly with noise, the input signal can be provided to the second statistics component 520 by the voice activity detector 540.

To simplify the notation, an input vector x(n) is formed by replicating the input samples as many times as filter taps that will use that sample, the input vector x(n), contains samples from substantially all input channels, and from current and past (or "future") sample of each of those channels. So, for example, if one microphone signal is denoted as $x_1(n)$, and another microphone signal as $x_2(n)$, an input vector x(n) for a 3-tap per channel array can be composed as:

$$x(n)=[x_1(n-1)x_1(n)x_1(n+1)x_2(n-1)\ x_2(n)x_2(n)] \quad (11)$$

Therefore, at a time instant n, x(n) is a T×1 vector, where T is the number of total taps in the filter (e.g., generally the number of channels multiplied by the number of taps used for each channel). Furthermore, for simplification of explanation, the time index n will be dropped, x will be used to denote the input vector. A similar notation will be employed for other vectors and variables.

It can be assumed that noise is linearly added to the desired signal. In other words, the input signal can be written as:

$$x=s+n \quad (12)$$

where s is the speech component of the signal and n is the additive ambient or interfering noise. Furthermore, it can be assumed that the noise is statistically independent from the desired signal, although it might be correlated between different microphones.

The basic hypothesis is that the desired signal is essentially the same on substantially all channels, possibly with the exception of a delay, or maybe different room-transfer functions. It is desired to compute a filter w, which will produce a single-channel output y, given by:

$$y=w.x \quad (13)$$

where w is the 1×T filter vector, and which minimizes an appropriate error measure between y and a desired signal d.

The spatial filter 530 can utilize a Wiener filter. In a Wiener filter, the received signal is filtered by a filter computed as:

$$w_{opt}=(R_{ss}+R_{nn})^{-1}(E\{sx\}), \quad (14)$$

where $R_{ss}$ is the autocorrelation matrix for the desired s, for example, stored in the second statistics component 520, $R_{nn}$ is the correlation matrix for the noise component n stored in the first statistics component 510, and $E\{sx\}$ is the cross correlation between the desired signal s and the received signal x.

The above can be directly generalized to a multi-channel situation, by simply forming a vector containing samples from several of the channels. Wiener filtering can be shown to be optimum in minimizing MSE between the desired signal and the output of the filter.

For example, in most practical situations, the filter output will not be the same as the desired signal, but a distorted version of the desired signal. The distortion introduced by the Wiener filtering can be separated into two parts: residual noise (e.g., remaining noise that was not removed by the filter), and signal distortion (e.g., modifications in the original signal introduced by the filter in trying to remove the noise). The human ear is more sensitive to independent noise. Therefore, Wiener filtering is not "human" optimum, in that it gives the same weight to these two kinds of distortion. Thus, the spatial filter 530 can utilize an improved filter, which accounts for these two differently. Given an error criteria, defined as:

$$\epsilon = E\{(w.s-d)^2 + \beta(w.n)^2\}. \quad (15)$$

where $\beta$ is a weighting parameter for the independent noise component. Thus, it can be shown that an improved filter is:

$$w_{opt} = (R_{ss} + \beta R_{nn})^{-1}(E\{dx\}). \quad (16)$$

This modification in the Wiener filter produces a sub-optimal filter in terms of MSE, but it can produce significantly better results, when judged on the subjective criteria of perceived quality, or when using the error criteria defined above.

In many situations, statistics for the desired signal are not available. In that case, the above equation can be modified:

$$w_{opt} = (R_{XX} + \rho R_{nn})^{-1}(E\{x_o x\} - E\{n_o n\}) \quad (17)$$

where $\rho = \beta - 1$. In this case the signal component received in one of the microphones (e.g., $x_o$) is selected as the desired signal. The subtracted term $E\{n_o n\}$ makes sure the noise present in that same microphone is not incorporated into the desired signal. Note the formulation in Equation (17) is appropriate for use with the system 500, as the statistics are based on the first portion of the input signal (e.g., noise) and the second portion of the input signal (e.g., noise+signal).

In one example, the signal and the noise have characteristics that are known beforehand. Accordingly, the spatial filter 530 can be computed a priori, and therefore be a fixed filter, with the advantage of reduced computational complexity.

In another example, advance knowledge of the signal and noise characteristics is minimal and/or may be time-varying. In this case, the noise statistic and the signal+noise statistics are estimated and the filter is computed in an adaptive way. This can be accomplished by including the voice activity detector 540, and re-estimating the statistic(s) periodically. The spatial filter 530 is then updated periodically, at the same or lower frequency than the statistics update. In one example, the spatial filter 530 is updated less frequently in order to reduce computational overhead. In another example, the filters are adapted in an LMS-like fashion, as it will be explained later in association with FIG. 7.

It is to be appreciated that the first statistics component 510, the second statistics component 520, the spatial filter 530 and/or the voice activity detector 540 can be implemented as one or more computer components, as that term is defined herein.

Figure 6:
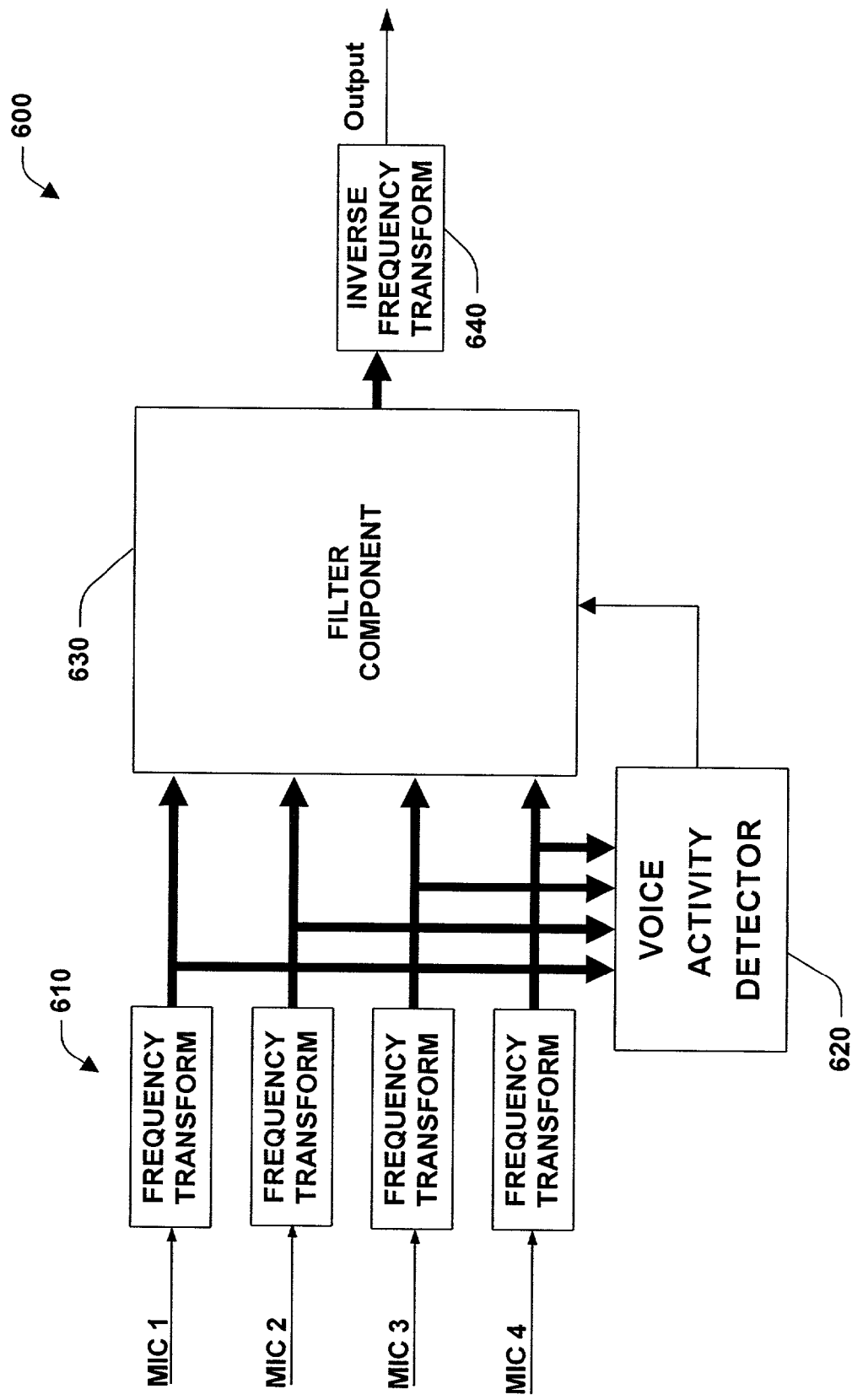
FIG. 6 is a block diagram of a frequency domain acoustic noise reduction system in accordance with an aspect of the present invention.

Turning to FIG. 6, a frequency domain noise reduction system 600 in accordance with an aspect of the present invention is illustrated. The system 600 includes a plurality of frequency transforms 610, a voice activity detector 620, a filter component 630 and an inverse frequency transform 640.

It is often beneficial for computational and/or performance reasons to compute and process the filters above described in the frequency domain. Several methods can be used to that end, in particular a modulated complex lapped transform (MCLT). In this example, the plurality of frequency transform 610 implement an MCLT of input signals. The filter component 630 may employ the filtering described with respect to FIG. 5 or 7, except that the filtering is performed, for example, for each band. In other words, a filter is computed for each band, and that filter is used to process the samples for that band coming out from the microphones.

It is to be appreciated that the plurality of frequency transforms 610, the voice activity detector 620, the filter component 630 and/or the inverse frequency transform 640 can be implemented as one or more computer components, as that term is defined herein.

The matrix inversion implied in Equation (17) can be computationally demanding, even if one uses the properties of the correlation matrix. One possibility to reduce complexity is to use an LMS adaptive filter.

An LMS adaptive filter converges to the optimum filter w, which minimizes the traditional mean squared error (MSE) between the output of the filter, and the desired signal. For example, given an input signal z, and a desired signal d, this adaptive filter will converge to the optimum filter, which is:

$$w = (R_{22})^{-1}E\{dz\}. \quad (18)$$

where $R_{22}$ is the autocorrelation matrix for the signal z.

This equation is similar to Equation (17), with two exceptions: first, the desired signal is not utilized; and, second, it is minimizing the wrong error criteria. A LMS formulation cannot, therefore, be used directly. Accordingly, "artificial" signals are created that will make the LMS filter converge to our desired filter. In other words, input and desired signals are synthesized that will generally make the LMS filter converge to the filter in Equation (17).

Since the signal and noise are independent, the first term can be made the same by adding some noise to the signal, for example, by making $z = x + \lambda n$, where n is noise obtained from the "noise buffer", and $\lambda$ is a scalar gain. Using the fact that x and n are independent, by making $\lambda = \text{sqrt}(\rho)$, results in $R_{zz} = R_{xx} + \rho R_{nn}$. Therefore, this choice for z makes the first part of equations (17) and (18) be substantially the same.

In order to make the second part of equations (17) and (18) match, the input signal $x_0$ cannot be used as the desired signal, because the term $-E\{n_o n\}$ would not be present. To correct for that term, the desired signal $d = x_0 - \lambda^{-1} n_0$ is used instead. This choice yields:

$$E\{dz\} = E\{(x_0 - \lambda^{-1}n_0)(x+\lambda n)\} = E\{x_0 x - \lambda^{-1}n_0 x + x_0 \lambda n - \lambda^{-1}n_0\lambda\} \quad (19)$$

Since n and x are independent, the expected value of cross products are zero, thus leading to:

$$E\{dz\} = E\{(x_0 - \lambda^{-1}n_0)(x+\lambda n)\} = E\{x_0 x\} - E\{n_0 n\} \quad (20)$$

And therefore this makes the second part of equation (17) and (18) match. Accordingly, this particular choice of input and desired signals will make the LMS filter converge to the desired filter.

Figure 7:
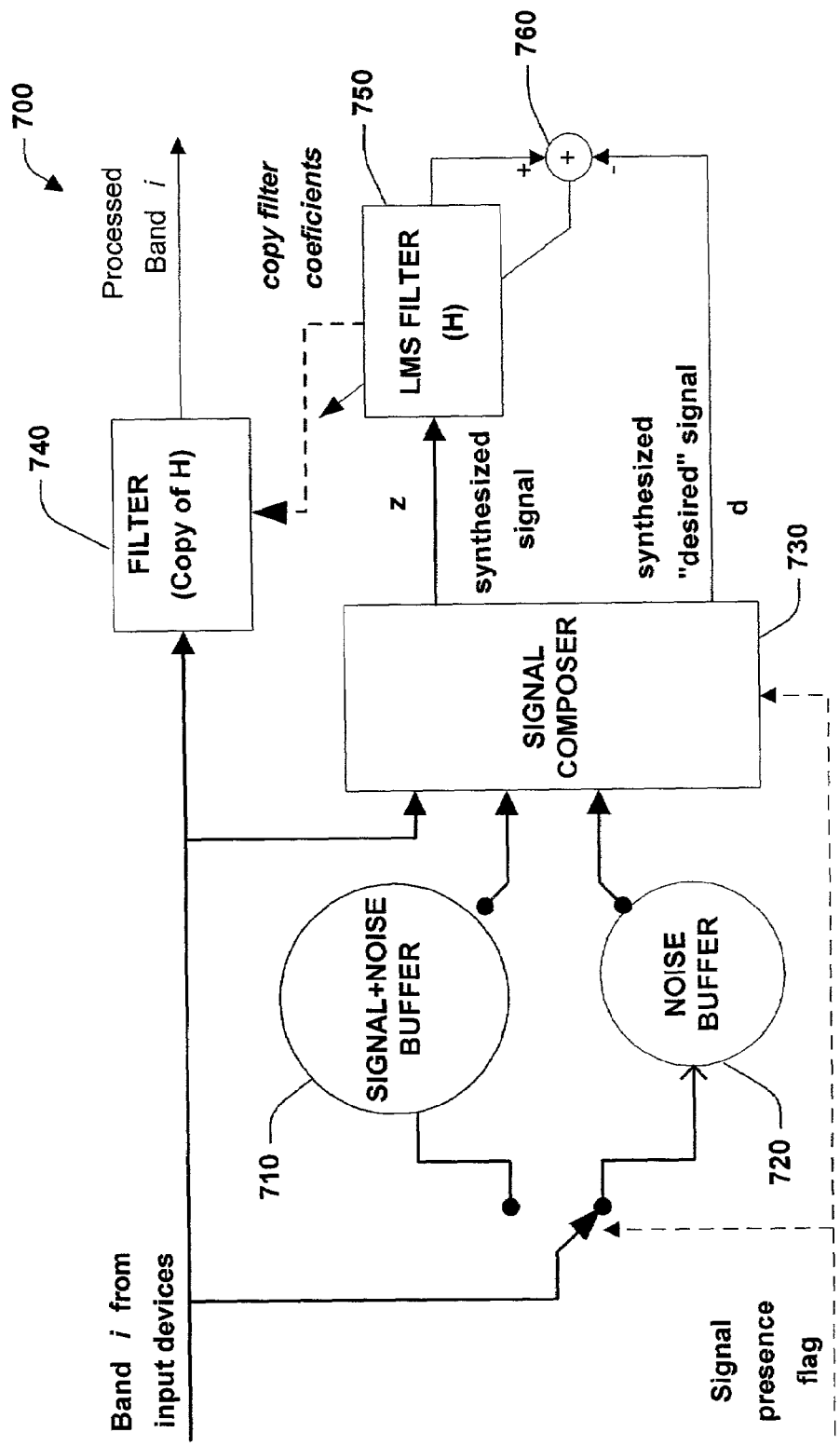
FIG. 7 is a block diagram of an acoustic noise reduction system in accordance with an aspect of the present invention.

Turning next to FIG. 7, an LMS-based noise reduction system 700 in accordance with an aspect of the present invention is illustrated. The system 700 includes a signal+ noise buffer 710, a noise buffer 720, a signal composer 730, a filter 740, an LMS filter 750 and differential component 760.

The algorithm described with respect to FIGS. 5 and 6 works based on the differences between the statistics of the signal and noise. These statistics are computed in a two-phase process ("noise only" and "signal+noise"), and stored as internal states in the system, represented by the two matrices (e.g., one for each phase). The adaptation is therefore based on using the incoming signal to update one of these matrices at a time, according to the presence (or absence) of the desired signal. In contrast, an LMS-based filter doesn't have the same two separate internal states matrices. It usually incorporates input data directly into the filter coefficients, and therefore does not allow for this two-phase process.

To circumvent this problem, it is first noted note that the data contained in the statistics matrices is essentially a subset of the information contained in the corresponding signals, from which the matrices were computed. So, instead of storing the two statistics matrices, the data itself is stored in two separate buffers (e.g., circular), the signal+noise buffer 710 and the noise buffer 720, which are used to directly adapt the LMS filter 750. More precisely, the incoming data is classified, for example, by a voice activity detector (not shown) as either "signal+noise" or "noise," and stored in the appropriate buffer, signal+noise buffer 710 and noise buffer 720, respectively, for later usage. For example, a signal presence flag or other signal can be received from the voice activity detector.

A synthetic input signal z and its associated desired signal d are generated by the signal composer 730 by adding data from the signal+noise buffer 710 and/or the noise buffer 720 to the input data. This synthetic signal is used to adapt the LMS filter 750. The filter coefficients are copied (e.g., continuously) to the filter 740, which directly processes the input signal.

This approach reduces the need for calibration signal(s) as with conventional system(s), thus making the overall system more robust to changes in the environment, the speaker, the noise, and/or the microphones. Also, the careful choice of synthetic signals—as described below—avoids the need to acquire a "clean" signal. FIG. 7 illustrates an LMS-based noise reduction system for a single frequency band.

A factor in achieving the desired results is, of course, how to compose the signals that are used to adapt the LMS filter. In one example, the composed signals are based on the optimization criteria discussed before, and assuming the signal+noise buffer 710 and/or the noise buffer 720 are short enough so that the signals contained in each are representative of the two classes. A two-phase composition can be employed: if speech is detected in the incoming signal x, more noise is added (from the noise buffer 720), to facilitate achieving the desired extra noise attenuation. In other words, the input signal z to the adaptive filter is computed as:

$$z = x + \rho n, \qquad (21)$$

and the desired signal is set to:

$$d = x_0 - \frac{1}{\rho} n_0. \qquad (22)$$

Note the negative term added to the desired noise which is used, for example, to prevent the small amount of noise present in $x_0$ from being preserved. Instead, the filter will converge to an unbiased estimate of the filter. On the other hand, when substantially no speech is detected in the incoming signal, a small amount of signal is added, to avoid converging to a signal-canceling filter:

$$z = \rho x + s, \qquad (23)$$

and set the associated desired signal to:

$$d = -\frac{1}{\rho} x_0 + s_0. \qquad (24)$$

Note again the negative term in the desired signal, which has substantially the same purpose as described before. Note also that the input signal is scaled in such a way that the energy at the input of the filter does not vary significantly between speech and silence periods.

Finally, the signal presence flag provided by the voice activity detector (not shown) is used, for example, for two purposes. A first use is to decide between using equations (21) and (22) or equations (23) and (24) to synthesize the signals. While the algorithm adds different signals—depending on the signal presence flag—this is not actually critical. An eventual misclassification may slow down convergence, but will not have significant consequences otherwise. A second use of the signal presence flag is to decide in which buffer to store the signal. In contrast with the first case, a misclassification in the second use may degrade performance significantly. Including part(s) of the desired signal in the noise buffer may lead to signal cancellation. To alleviate this problem, two distinct speech activity detectors can be used, one for each of these uses. Since the second use of the signal presence flag is not in the direct signal path, a more robust, long-delay voice activity detector can be used to decide in which buffer to store the incoming signal. This voice activity detector can have a "not-sure" region, where the signal is not stored in either buffer. Thus, adaptation can be based, at least in part upon, data stored in the system 700 in a different order than the time-of-arrival order.

It is to be appreciated that the signal+noise buffer 710, the noise buffer 720, the signal composer 730, the filter 740, the LMS filter 750 and/or the differential component 760 can be implemented as one or more computer components, as that term is defined herein.

Figure 8:
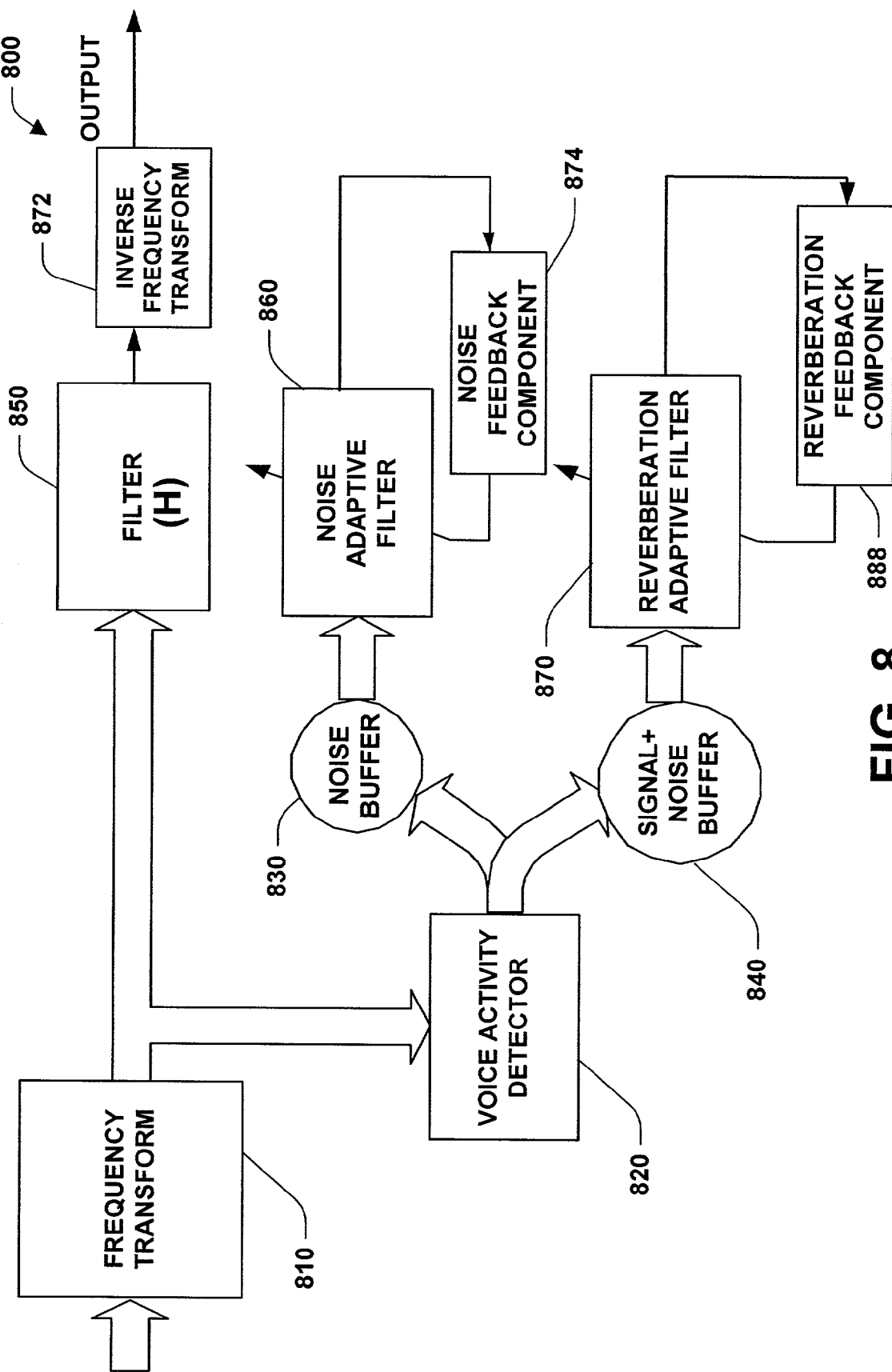
FIG. 8 is a block diagram of a signal enhancement system in accordance with an aspect of the present invention.

Referring next to FIG. 8, a signal enhancement system 800 in accordance with an aspect of the present invention is illustrated. The system 800 includes a frequency transform 810, a voice activity detector 820, a noise buffer 830, a signal+noise buffer 840, a filter 850, a noise adaptive filter 860, a reverberation adaptive filter 870, an inverse frequency transform 872, a noise feedback component 874 and a reverberation feedback component 888.

The frequency transform 810 performs a frequency domain transform of an input signal. In one example, the frequency transform 810 employs an MCLT that decomposes the input signal into M complex subbands. However, it is to be appreciated that any suitable frequency domain transform can be employed by the frequency transform 810 in accordance with the present invention.

The voice activity detector 820 provides information to the noise buffer 830 and/or the signal+noise buffer 840 based, at least in part, upon the input signal. The voice activity detector 820 detects when substantially only noise is present (e.g., silent period(s)) and provides the input signal to the noise buffer 830. When speech is present, possibly with noise, the input signal can be provided to the noise+signal buffer 840 by the voice activity detector 820. In one example, the voice activity 820 discards sample(s) of the input signal which it is unable to classify as noise or "signal+noise".

The signals stored in the noise buffer 830 are used to train the noise adaptive filter 860 while the signal stored in the noise+signal buffer 840 are used train the reverberation adaptive filter 870. By using signals from the noise buffer 830 and/or the noise+signal buffer 840, the noise adaptive filter 860 and/or the reverberation adaptive filter are trained on a signal that is slightly older. In most cases, the signal and noise characteristics do not change too abruptly, and this delay does not constitute a problem. Note also that the rate of adaptation can be the same, higher or lower than the data rate. By same data rate it is meant that one sample from each buffer is processed for each sample that is received as input. A lower adaptation rate reduces complexity, while a higher rate can improve convergence and/or tracking of the environment change(s).

The filter 850 filters the frequency transform input signal received from the frequency transform 810 based, at least in part, upon a plurality of adaptive coefficients. The filter 850 provides a filtered output to the inverse frequency transform 872 which performs an inverse frequency transform (e.g., inverse MCLT) and provides an acoustic enhancement signal output. The plurality of adaptive coefficients utilized by the filter 850 are modified by the noise adaptive filter 860 and/or the reverberation adaptive filter 870.

The noise adaptive filter 860 filters the signals stored in the noise buffer 830 based, at least in part, upon the plurality of adaptive coefficients. The noise adaptive filter 860 is adapted to modify at least one of the plurality of adaptive coefficients based, at least in part, upon a feedback output from the noise feedback component 874.

The noise adaptive filter 860 can employ the improved Wiener filter technique(s) described above. In the instance in which the noise adaptive filter 860 is adapted to modify the plurality of adaptive coefficients based, at least in part, upon equations (16) and (17) above. The noise adaptive filter 860 further provides an output to the noise feedback component 874.

The noise feedback component 874 provides the noise reduction feedback output based, at least in part, upon a weighted error calculation of the output of the noise reduction adaptive filter.

The reverberation adaptive filter 870 filters the signals stored in the noise+signal buffer 840 based, at least in part, upon the plurality of adaptive coefficients. The reverberation adaptive filter 870 is adapted to modify at least one of the plurality of adaptive coefficients based, at least in part, upon a feedback output from the reverberation feedback component 888.

The reverberation adaptive filter 870 employs a reverberation measuring filter technology based on a non-linear function, for example, the kurtosis metric. In the instance in which the reverberation adaptive filter 870 is adapted to maximize the kurtosis ($J(n)$) of an input signal $\tilde{x}(n)$, the reverberation adaptive filter 870 can modify the plurality of adaptive coefficients based, at least in part, upon equations (1), (2), (3) and (4) above. The reverberation adaptive filter 870 further provides an output to the reverberation feedback component 888.

The reverberation feedback component 888 provides the feedback output $f(n)$ which is used by the reverberation adaptive filter 870 to control filter updates. The feedback output can be based, at least in part, upon a non-linear function of the output of the reverberation adaptive filter 870. For example, the feedback component 894 can employ, at least in part, equation (5) above.

It is to be appreciated that the frequency transform 810, the voice activity detector 820, the noise buffer 830, the signal+noise buffer 840, the filter 850, the noise adaptive filter 860, the reverberation adaptive filter 870, the inverse frequency transform 872, the noise feedback component 874 and/or the reverberation feedback component 888 can be implemented as one or more computer components, as that term is defined herein.

In the examples previously described, the input to the noise adaptive filter 860 and/or the reverberation adaptive filter 870 filter is the LPC residual of the corresponding signal. This can have, for example, two main objectives; first, it equalizes the signal, improving convergence. Second, it provides the output of the filter is already in the LPC residual of the filtered signal. This second attribute is necessary because the (reverberation reducing) nonlinear feedback function is based on maximizing the "impulse train-like" characteristics of this LPC residual. An alternative to filtering the input signal, which may be advantageous in some situations is provided below.

In one example, to reduce computational complexity, the training data is not filtered by an LPC filter. Instead, the (single channel) output of the filter is filtered twice by the LPC filter. The second filter uses the symmetric reflection of the LPC filter. Not does only this reduces complexity, but it also allows the LPC filter to be computed on the noise reduced signal, improving performance in noisy situations. This can be seen as incorporating the LPC filtering within the feedback function.

In view of the exemplary systems shown and described above, methodologies that may be implemented in accordance with the present invention will be better appreciated with reference to the flow charts of FIGS. 9, 10, 11, 12, 13 and 14. While, for purposes of simplicity of explanation, the methodologies are shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement the methodologies in accordance with the present invention.

The invention may be described in the general context of computer-executable instructions, such as program modules, executed by one or more components. Generally, program modules include routines, programs, objects, data structures, etc. that perform particular tasks or implement particular abstract data types. Typically the functionality of the program modules may be combined or distributed as desired in various embodiments.

Figure 9:
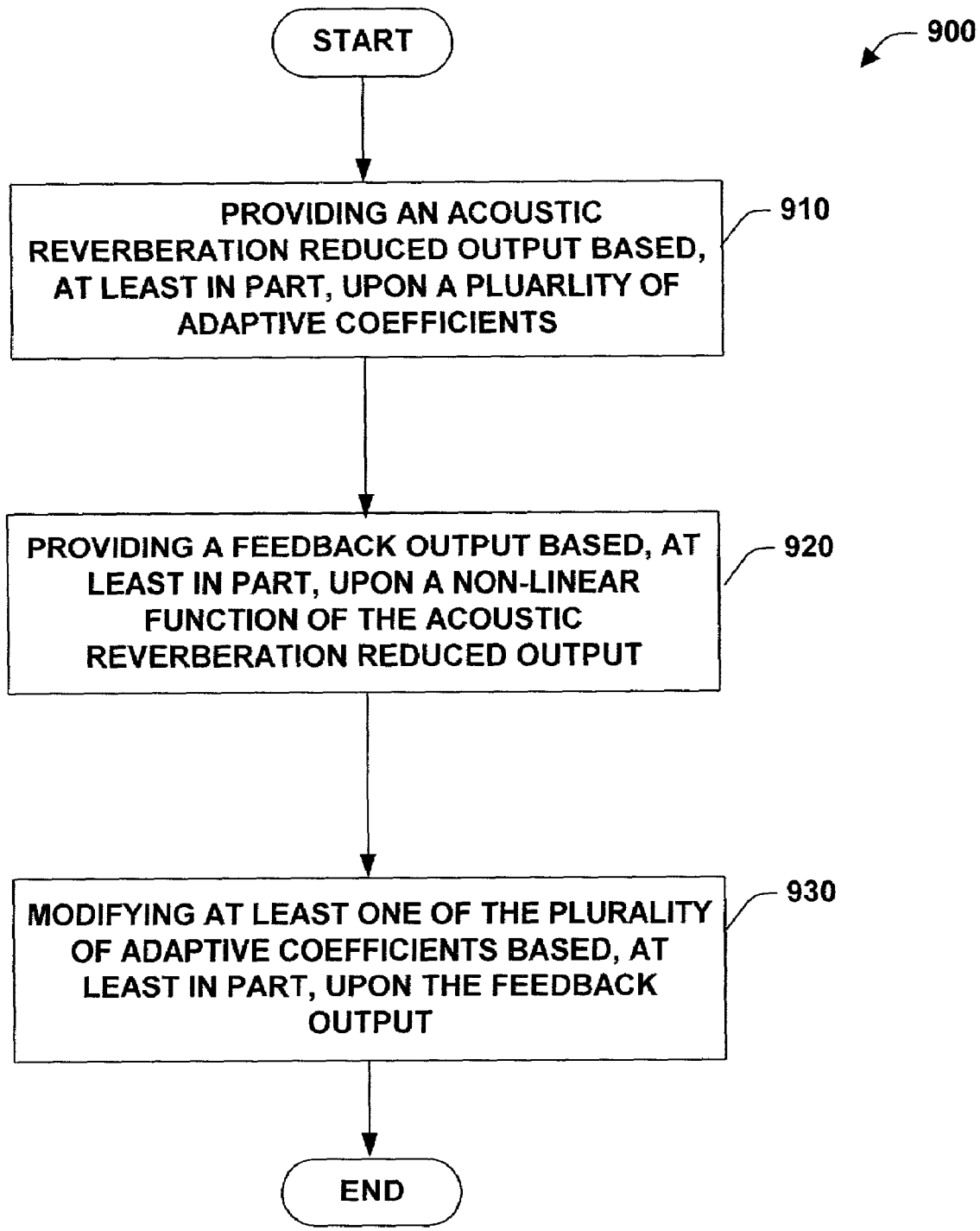
FIG. 9 is a flow chart illustrating a methodology for reducing acoustic reverberation in accordance with an aspect of the present invention.

Turning to FIG. 9, a method 900 for reducing acoustic reverberation in accordance with an aspect of the present invention is illustrated. At 910, an acoustic reverberation reduced output based, at least in part, upon a plurality of adaptive coefficients is provided. At 920, a coefficient adaptation feedback output is provided based, at least in part, upon a non-linear function of the acoustic reverberation reduced output. For example, the non-linear function can be based, at least in part, upon maximization of kurtosis. At 930, at least one of the plurality of adaptive coefficient is modified based, at least in part, upon a feedback output.

Figure 10:
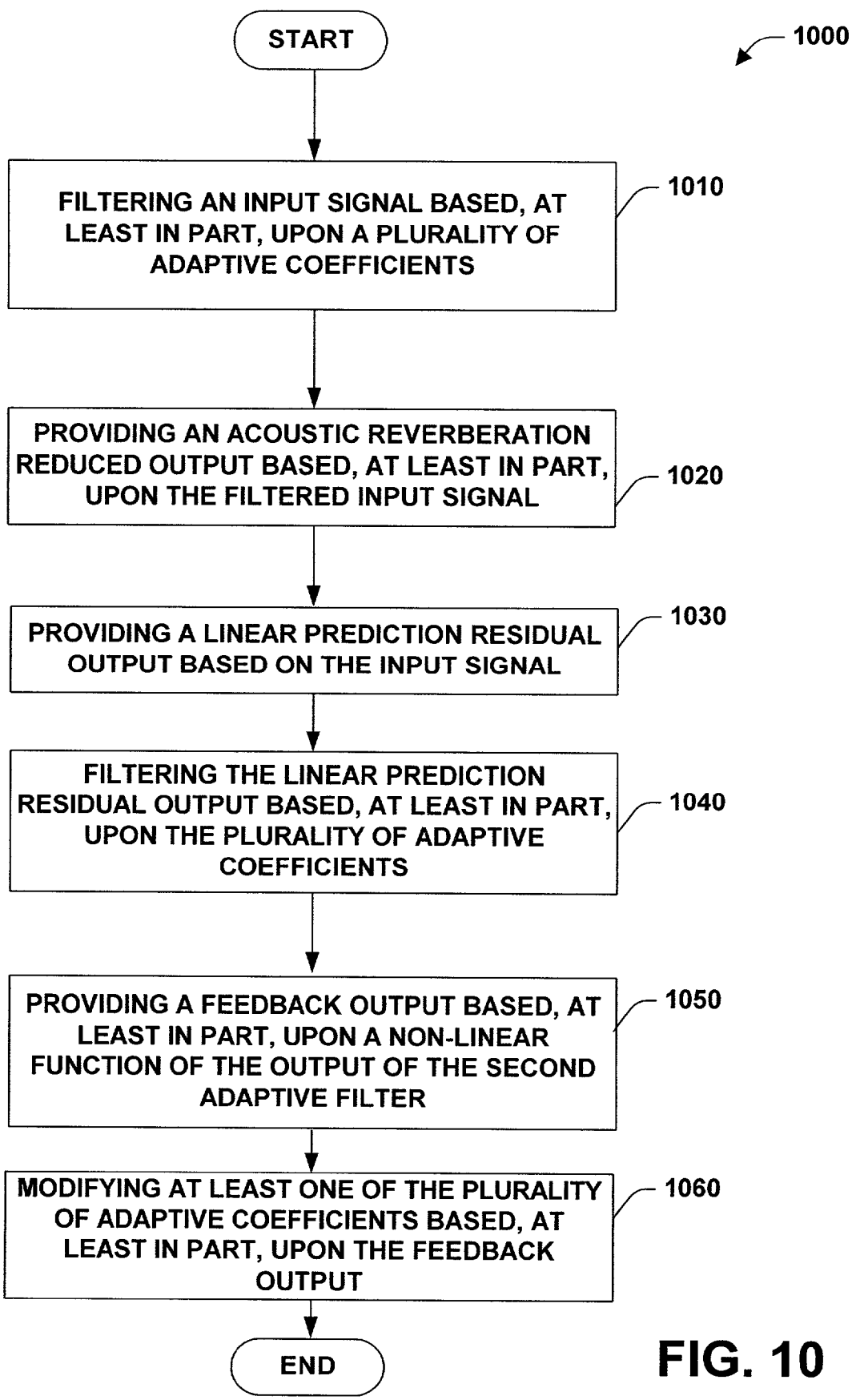
FIG. 10 is a flow chart illustrating a methodology for reducing acoustic reverberation in accordance with an aspect of the present invention.

Next, referring to FIG. 10, a method 1000 for reducing acoustic reverberation in accordance with an aspect of the present invention is illustrated. At 1010, an input signal is filtered based, at least in part, upon a plurality of adaptive coefficients. At 1020, an acoustic reverberation reduced output is provided based, at least in part, upon the filtered input signal. Next, at 1030, a linear prediction residual output is provided based on the input signal. At 1040, the linear prediction residual output is filtered based, at least in part, upon the plurality of adaptive coefficients. At 1050, a feedback output (e.g., for adapting at least one of the plurality of adaptive coefficients) is provided based, at least in part, upon a non-linear function (e.g., based, at least in part, upon maximization of kurtosis) of the filtered linear prediction residual output. At 1060, at least one of the plurality of adaptive coefficients is modified based, at least in part, upon the feedback output.

Figure 11:
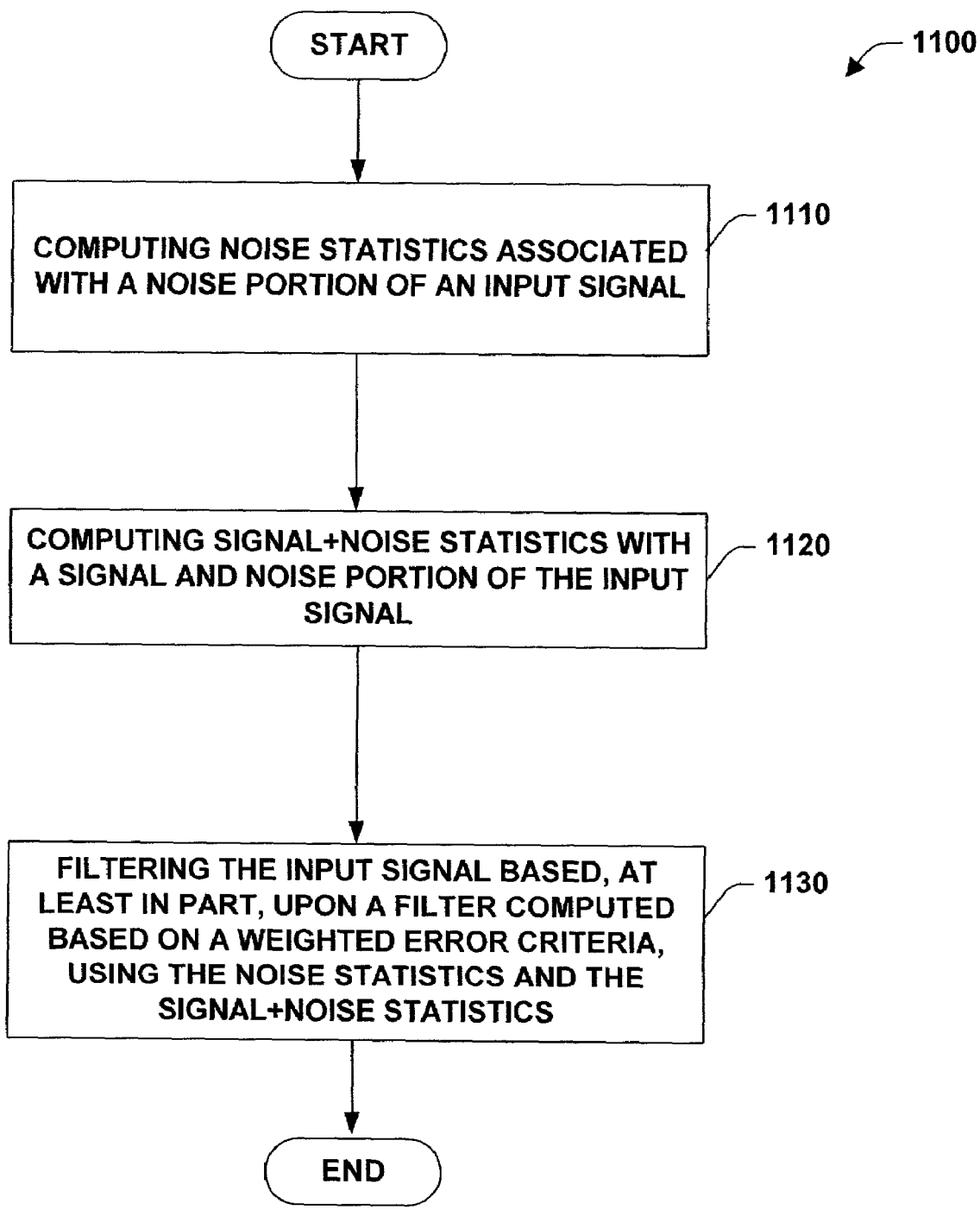
FIG. 11 is a flow chart illustrating a methodology for reducing acoustic noise in accordance with an aspect of the present invention.

Turning next to FIG. 11, a method 1100 for reducing acoustic noise in accordance with an aspect of the present invention is illustrated. At 1010, noise statistics associated with a noise portion of an input signal are computed. At 1020, signal+noise statistics with a signal and noise portion of the input signal are computed. At 1030, the input signal is filtered based, at least in part, upon a filter computed based on optimizing a weighted error criteria, based on calculation of the noise statistics and the signal+noise statistics.

Figure 12:
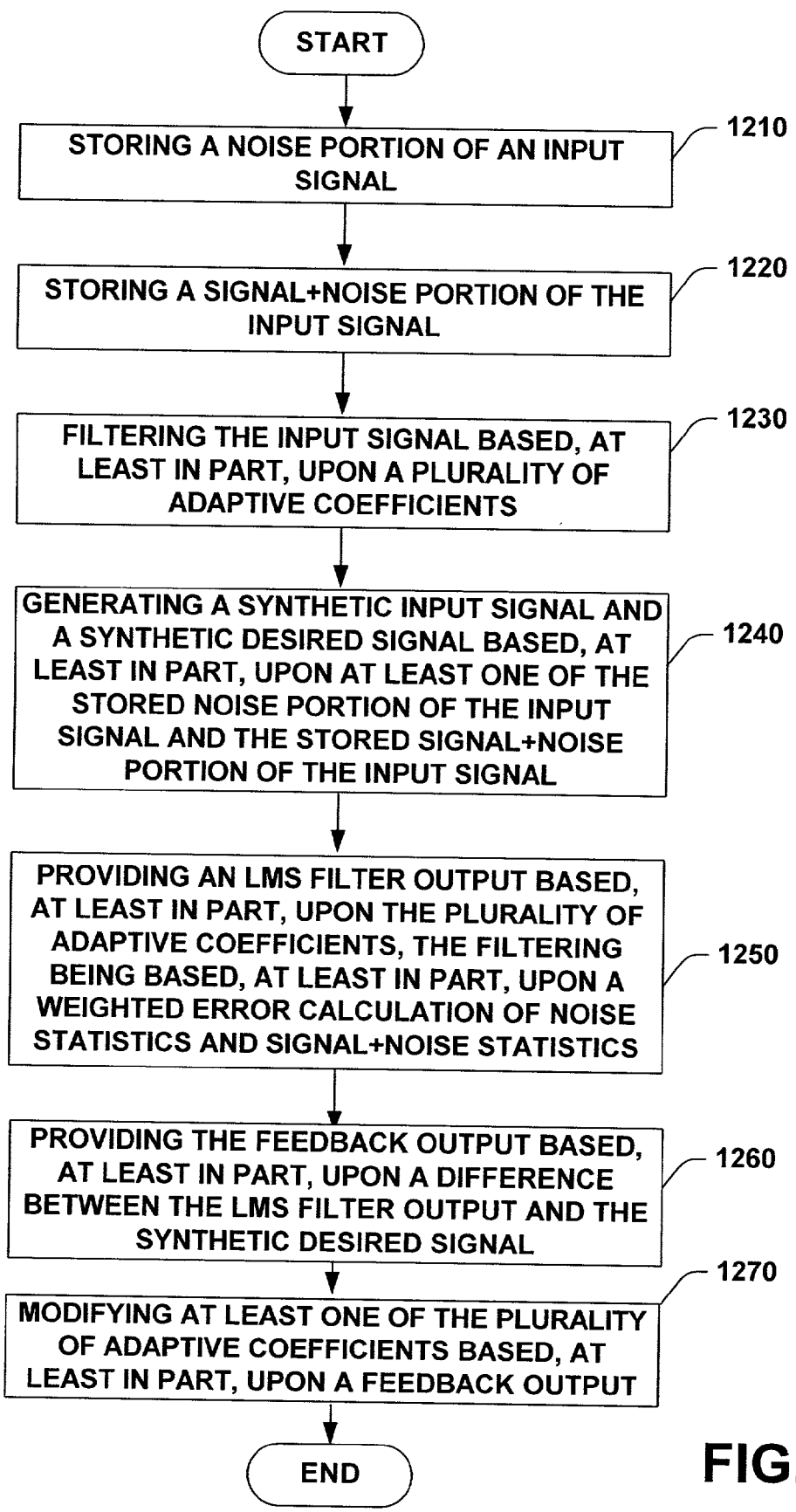
FIG. 12 is a flow chart illustrating a methodology for reducing acoustic noise in accordance with an aspect of the present invention.

Referring next to FIG. 12, a method 1200 for reducing acoustic noise in accordance with an aspect of the present invention is illustrated. At 1210, a noise portion of an input signal is stored. At 1220, a signal+noise portion of the input signal is stored. Next, at 1230, the input signal is filtered based, at least in part, upon a plurality of adaptive coefficients. At 1240, a synthetic input signal and a synthetic desired signal are generated based, at least in part, upon at least one of the stored noise portion of the input signal and the stored signal+noise portion of the input signal. For example, the synthetic signals can be chosen, at least in part, to optimize a weighted error criteria of residual noise and signal distortion.

At 1250, an LMS filter output is provided based, at least in part, upon the plurality of adaptive coefficients. At 1260, a feedback output is provided based, at least in part, upon a difference between the LMS filter output and the synthetic desired signal. At 1270, at least one of the plurality of adaptive coefficients is modified based, at least in part, upon the feedback output.

Figure 13:
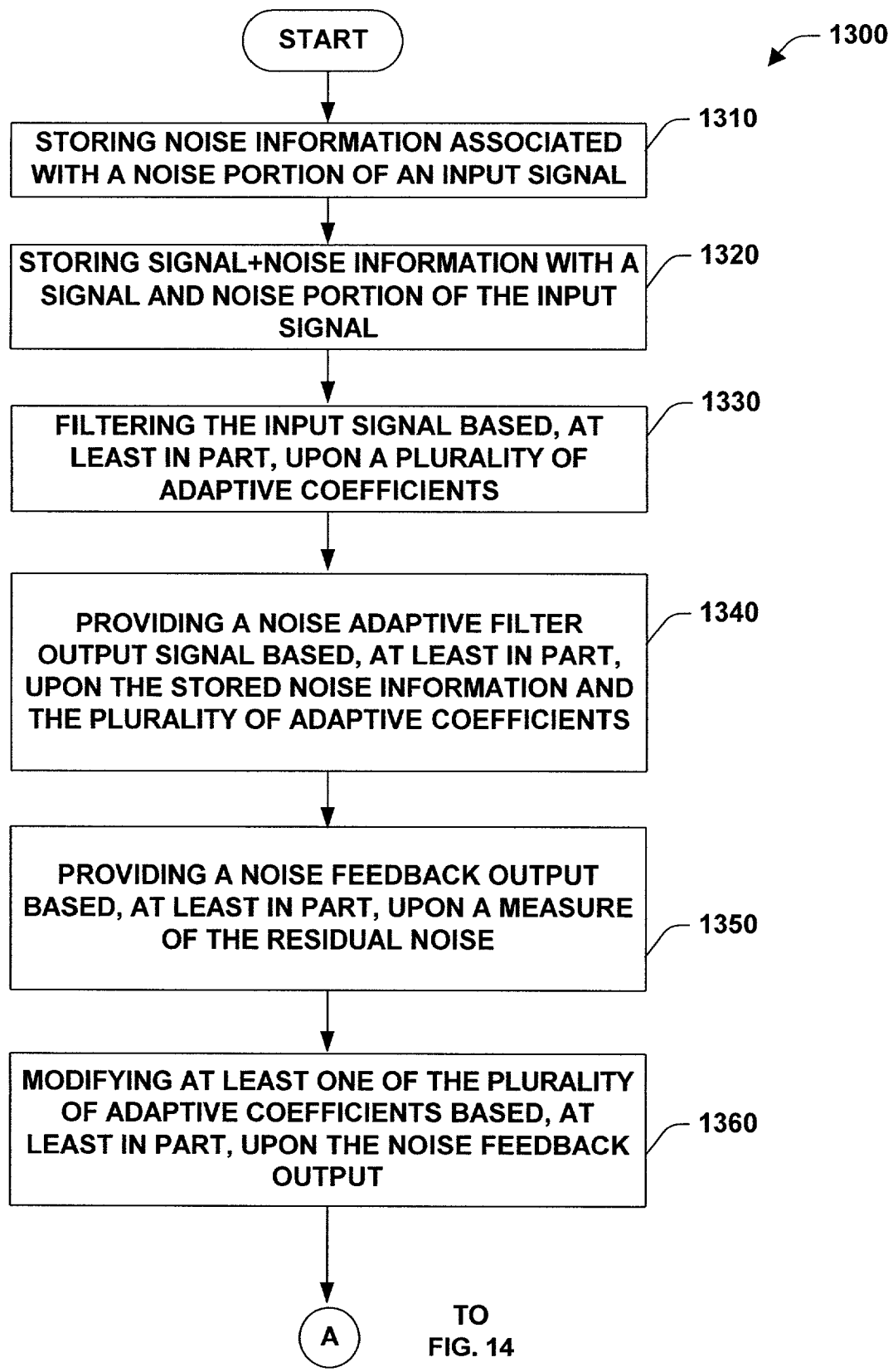
FIG. 13 is a flow chart illustrating a methodology for enhancing an acoustic signal in accordance with an aspect of the present invention.
Figure 14:
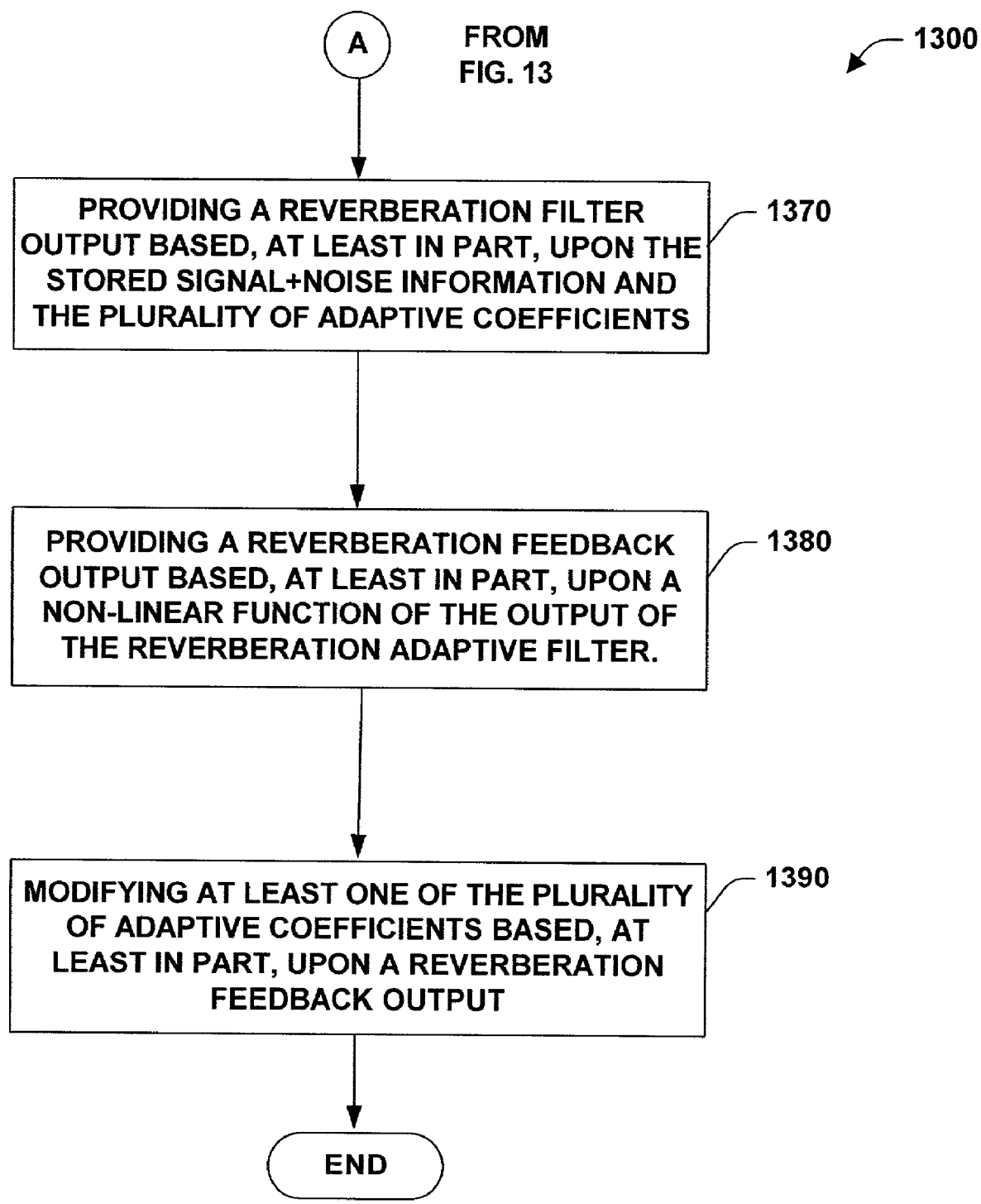
FIG. 14 is a flow chart further illustrating the method of FIG. 13 in accordance with an aspect of the present invention.

Turning to FIGS. 13 and 14, a method 1300 for enhancing an acoustic signal in accordance with an aspect of the present invention is illustrated. At 1310, noise information associated with a noise portion of an input signal is stored. At 1320, signal+noise information with a signal and noise portion of the input signal is stored. At 1330, the input signal is filtered based, at least in part, upon a plurality of adaptive coefficients.

At 1340, a noise adaptive filter output signal is provided based, at least in part, upon the stored noise information and the plurality of adaptive coefficients. At 1350, a noise feedback output is provided based, at least in part, upon a measure of the residual noise. At 1360, at least one of the plurality of adaptive coefficients is modified based, at least in part, upon the noise feedback output.

At 1370, a reverberation filter output is provided based, at least in part, upon the stored signal+noise information and the plurality of adaptive coefficients. At 1380, a reverberation feedback output is provided based, at least in part, upon a non-linear function of the output of the reverberation adaptive filter. At 1390, at least one of the plurality of adaptive coefficients is modified based, at least in part, upon the reverberation feedback output.

It is to be appreciated that the system and/or method of the present invention can be utilized in an overall signal enhancement system. Further, those skilled in the art will recognize that the system and/or method of the present invention can be employed in a vast array of acoustic applications, including, but not limited to, teleconferencing and/or speech recognition. It is also to be appreciated that the system and/or method of the present invention can be applied to handle multi-channel inputs (based on a plurality of input devices, for example, microphones).

Figure 15:
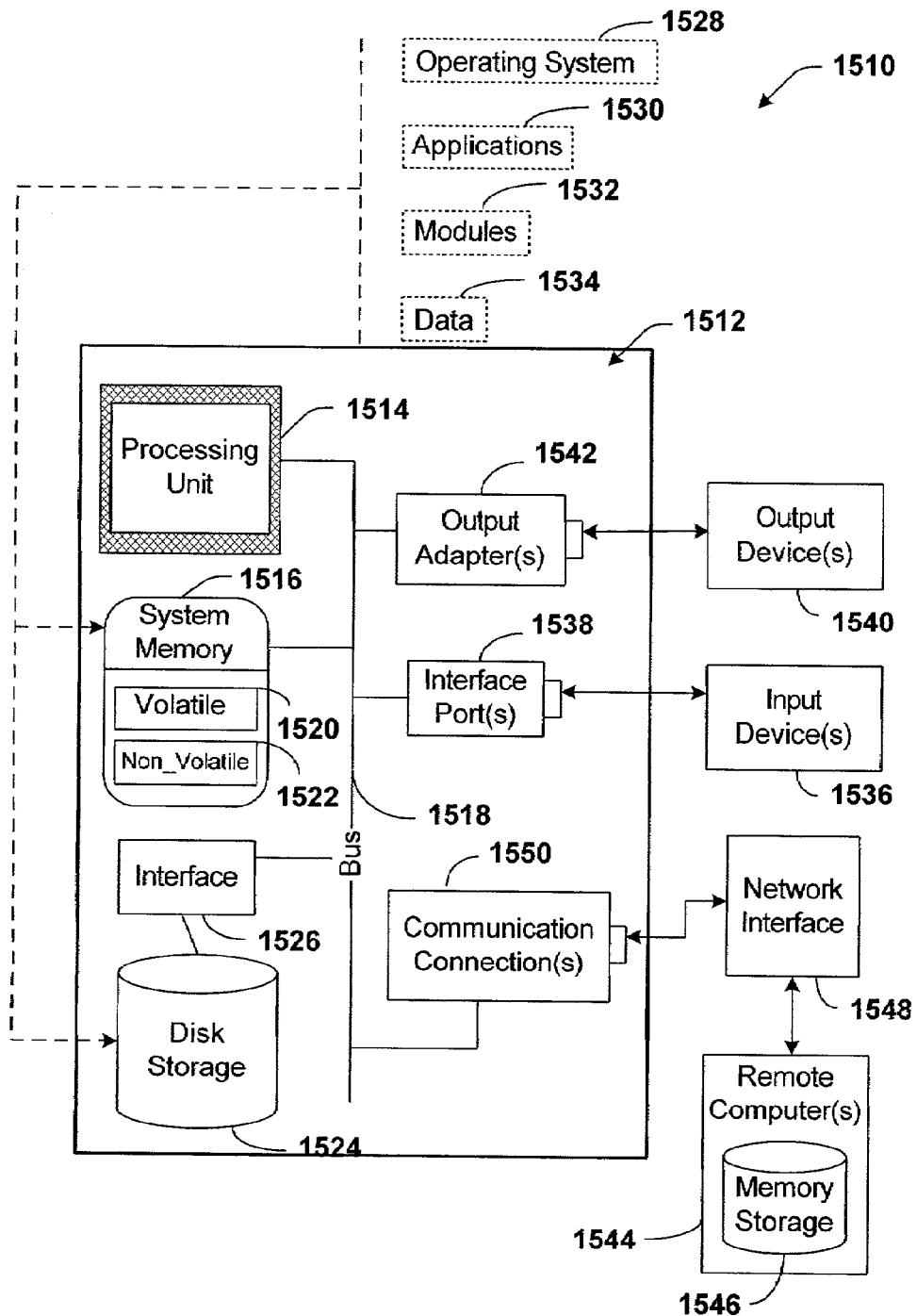
FIG. 15 illustrates an example operating environment in which the present invention may function.

In order to provide additional context for various aspects of the present invention, FIG. 15 and the following discussion are intended to provide a brief, general description of a suitable operating environment 1510 in which various aspects of the present invention may be implemented. While the invention is described in the general context of computer-executable instructions, such as program modules, executed by one or more computers or other devices, those skilled in the art will recognize that the invention can also be implemented in combination with other program modules and/or as a combination of hardware and software. Generally, however, program modules include routines, programs, objects, components, data structures, etc. that perform particular tasks or implement particular data types. The operating environment 1510 is only one example of a suitable operating environment and is not intended to suggest any limitation as to the scope of use or functionality of the invention. Other well known computer systems, environments, and/or configurations that may be suitable for use with the invention include but are not limited to, personal computers, hand-held or laptop devices, multiprocessor systems, microprocessor-based systems, programmable consumer electronics, network PCs, minicomputers, mainframe computers, distributed computing environments that include the above systems or devices, and the like.

With reference to FIG. 15, an exemplary environment 1510 for implementing various aspects of the invention includes a computer 1512. The computer 1512 includes a processing unit 1514, a system memory 1516, and a system bus 1518. The system bus 1518 couples system components including, but not limited to, the system memory 1516 to the processing unit 1514. The processing unit 1514 can be any of various available processors. Dual microprocessors and other multiprocessor architectures also can be employed as the processing unit 1514.

The system bus 1518 can be any of several types of bus structure(s) including the memory bus or memory controller, a peripheral bus or external bus, and/or a local bus using any variety of available bus architectures including, but not limited to, 15-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1516 includes volatile memory 1520 and nonvolatile memory 1522. The basic input/output system (BIOS), containing the basic routines to transfer information between elements within the computer 1512, such as during start-up, is stored in nonvolatile memory 1522. By way of illustration, and not limitation, nonvolatile memory 1522 can include read only memory (ROM), programmable ROM (PROM), electrically programmable ROM (EPROM), electrically erasable ROM (EEPROM), or flash memory. Volatile memory 1520 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1512 also includes removable/nonremovable, volatile/nonvolatile computer storage media. FIG. 15 illustrates, for example a disk storage 1524. Disk storage 1524 includes, but is not limited to, devices like a magnetic disk drive, floppy disk drive, tape drive, Jaz drive, Zip drive, LS-100 drive, flash memory card, or memory stick. In addition, disk storage 1524 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1524 to the system bus 1518, a removable or non-removable interface is typically used such as interface 1526.

It is to be appreciated that FIG. 15 describes software that acts as an intermediary between users and the basic computer resources described in suitable operating environment 1510. Such software includes an operating system 1528. Operating system 1528, which can be stored on disk storage 1524, acts to control and allocate resources of the computer system 1512. System applications 1530 take advantage of the management of resources by operating system 1528 through program modules 1532 and program data 1534 stored either in system memory 1516 or on disk storage 1524. It is to be appreciated that the present invention can be implemented with various operating systems or combinations of operating systems.

A user enters commands or information into the computer 1512 through input device(s) 1536. Input devices 1536 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1514 through the system bus 1518 via interface port(s) 1538. Interface port(s) 1538 include, for example, a serial port, a parallel port, a game port, and a universal serial bus (USB). Output device(s) 1540 use some of the same type of ports as input device(s) 1536. Thus, for example, a USB port may be used to provide input to computer 1512, and to output information from computer 1512 to an output device 1540. Output adapter 1542 is provided to illustrate that there are some output devices 1540 like monitors, speakers, and printers among other output devices 1540 that require special adapters. The output adapters 1542 include, by way of illustration and not limitation, video and sound cards that provide a means of connection between the output device 1540 and the system bus 1518. It should be noted that other devices and/or systems of devices provide both input and output capabilities such as remote computer(s) 1544.

Computer 1512 can operate in a networked environment using logical connections to one or more remote computers, such as remote computer(s) 1544. The remote computer(s) 1544 can be a personal computer, a server, a router, a network PC, a workstation, a microprocessor based appliance, a peer device or other common network node and the like, and typically includes many or all of the elements described relative to computer 1512. For purposes of brevity, only a memory storage device 1546 is illustrated with remote computer(s) 1544. Remote computer(s) 1544 is logically connected to computer 1512 through a network interface 1548 and then physically connected via communication connection 1550. Network interface 1548 encompasses communication networks such as local-area networks (LAN) and wide-area networks (WAN). LAN technologies include Fiber Distributed Data Interface (FDDI), Copper Distributed Data Interface (CDDI), Ethernet/IEEE 1502.3, Token Ring/IEEE 1502.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1550 refers to the hardware/software employed to connect the network interface 1548 to the bus 1518. While communication connection 1550 is shown for illustrative clarity inside computer 1512, it can also be external to computer 1512. The hardware/software necessary for connection to the network interface 1548 includes, for exemplary purposes only, internal and external technologies such as, modems including regular telephone grade modems, cable modems and DSL modems, ISDN adapters, and Ethernet cards.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An audio enhancement system, comprising:
an adaptive filter that filters an input signal, at least in part, upon a plurality of adaptive coefficients, the adaptive filter modifying at least one of the plurality of adaptive coefficients based, at least in part, upon a feedback output, the adaptive filter providing a quality enhanced output; and,
a feedback component that provides the feedback output based, at least in part, upon a non-linear function of the quality enhanced output, the non-linear function being based, at least in part, upon the following equation:

$$J(n) = \frac{E\{\tilde{y}^4(n)\}}{E^2\{\tilde{y}^2(n)\}} - 3$$

where J(n) is the kurtosis metric,
y-tilda(n) is the quality enhanced output, and
E{} are expectations.

2. The audio enhancement system of claim 1, the non-linear function being based on increasing a non-linear measure of speechness.

3. The audio enhancement system of claim 2, the non-linear measure of speediness being based on maximizing kurtosis of a linear predictive coding (LPC) residual of the quality enhanced output.

4. The audio enhancement system of claim 2, the non-linear measure of speechness being based on maximizing the impulse-train like characteristic of a linear predictive coding (LPC) residual of the quality enhanced output.

5. The audio enhancement system of claim 1, the input signal being based on one microphone.

6. The audio enhancement system of claim 1, the input signal being based on at least two microphones.

7. An audio enhancement system, comprising:
a first adaptive filter that filters an input signal based, at least in part, upon a plurality of adaptive coefficients, the first adaptive filter providing a quality enhanced output;
a second adaptive filter that filters the input signal based, at least in part, upon the plurality of adaptive coefficients, the second adaptive filter modifying at least one of the plurality of adaptive coefficients based, at least in part, upon a feedback output, the second adaptive filter further providing an output; and,
a feedback component that provides the feedback output based, at least in part, upon a non-linear function of the output of the second adaptive filter, the non-linear function being based, at least in part, upon the following equation:

$$J(n) = \frac{E\{\tilde{y}^4(n)\}}{E^2\{\tilde{y}^2(n)\}} - 3$$

where J(n) is the kurtosis metric,
y-tilda(n) is the output of the second adaptive filter, and
E{} are expectations.

8. The audio enhancement system of claim 7, the second adaptive filter being adapted based on a delayed version of the input signal.

9. The audio enhancement system of claim 7, the second adaptive filter being adapted based on a modified version of the input signal.

10. The audio enhancement system of claim 7, the second adaptive filter being adapted based on an equalized version of the input signal.

11. The audio enhancement system of claim 7, the second adaptive filter running at a different data rate than the first adaptive filter.

12. The audio enhancement system of claim 11, the second adaptive filter running at a lower data rate than the first adaptive filter.

13. The audio enhancement system of claim 11, the second adaptive filter running at a higher data rate than the first adaptive filter.

14. The audio enhancement system of claim 7, the second adaptive filter using data stored in the system.

15. The audio enhancement system of claim 14, the second adaptive filter using the data stored in the system more than once.

16. The audio enhancement system of claim 14, the second adaptive filter using the data stored in the system in a different order than the time-of-arrival to a microphone order.

17. The audio enhancement system of claim 7, the adaptive filter using data modified to edit out non-voiced parts of the input signal.

18. The audio enhancement system of claim 7, further comprising a plurality of second adaptive filters.

19. The audio enhancement system of claim 18, the first adaptive filter and the plurality of second adaptive filters employing the same plurality of adaptive coefficients, the plurality of adaptive coefficients being modified, at least in part, based on an output of at least one of the second adaptive filters.

20. The audio enhancement system of claim 19, adaptation feedback provided by at least one of the second adaptive filters being based on a non-linear function.

21. An acoustic reverberation reduction system, comprising:
an adaptive filter that filters a linear prediction output based, at least in part, upon a plurality of adaptive coefficients, the adaptive filter modifying at least one of the plurality of adaptive coefficients based, at least in part, upon a feedback output, the adaptive filter providing an acoustic reverberation reduced output; and,
a feedback component that provides the feedback output based, at least in part, upon a non-linear function of the acoustic reverberation reduced output, the non-linear function being based, at least in part, upon the following equation:

$$J(n) = \frac{E\{\tilde{y}^4(n)\}}{E^2\{\tilde{y}^2(n)\}} - 3$$

where J(n) is the kurtosis metric,
y-tilda(n) is the acoustic reverberation reduced output, and
E{} are expectations.

22. The acoustic reverberation system of claim 21, further comprising a linear prediction analyzer that analyzes an input signal and provides the linear prediction residual output.

23. The acoustic reverberation system of claim 22, further comprising a linear prediction synthesis filter that filters the acoustic reverberation reduced output and provides a processed output signal.

24. The acoustic reverberation reduction system of claim 21, the non-linear function being based, at least in part, upon maximization of kurtosis.

25. The acoustic reverberation reduction system of claim 24, the non-linear function being based, at least in part, upon selecting a threshold, and providing positive feedback for samples above that threshold and negative feedback for samples below that threshold.

26. The acoustic reverberation system of claim 21, the feedback component employing linear predictive coding (LPC) filtering of the acoustic reverberation reduced output, the feedback output being based, at least in part, upon a non-linear function based on a LPC residual.

27. The acoustic reverberation system of claim 21, the feedback component employing linear predictive coding (LPC) filtering of the acoustic reverberation reduced output, the feedback output being based, at least in part, upon a non-linear function based on a LPC residual which increases the impulse-train characteristics of the LPC residual.

28. The acoustic reverberation system of claim 21, the feedback component employing linear predictive coding (LPC) filtering of the acoustic reverberation reduced output, the feedback output being based, at least in part, upon a non-linear function based on a LPC residual which increases the kurtosis of the LPC residual.

29. An acoustic reverberation reduction system, comprising:
a first adaptive filter that filters an input signal based, at least in part, upon a plurality of adaptive coefficients, the first adaptive filter providing an acoustic reverberation reduced output;
a second adaptive filter that filters a linear prediction output based, at least in part, upon the plurality of adaptive coefficients, the second adaptive filter modifying at least one of the plurality of adaptive coefficients based, at least in part, upon a feedback output, the second adaptive filter further providing an output; and, a feedback component that provides the feedback output based, at least in part, upon a non-linear function of the output of the second adaptive filter, the non-linear function being based, at least in part, upon the following equation:

$$J(n) = \frac{E\{\tilde{y}^4(n)\}}{E^2\{\tilde{y}^2(n)\}} - 3$$

where J(n) is the kurtosis metric,
y-tilda(n) is to output of the second adaptive filter, and
E{} are expectations.

30. The acoustic reverberation reduction system of claim 29, further comprising a linear prediction analyzer that analyzes the input signal and provides the linear prediction residual output.

31. The acoustic reverberation reduction system of claim 29, the non-linear function being based, at least in part, upon maximization of kurtosis.

32. The acoustic reverberation reduction system of claim 29, the first adaptive filter further comprising a frequency transform component that performs a frequency domain transform of the input signal, filtering of the first adaptive filter being performed on the frequency transformed input signal, the first adaptive filter further comprising an inverse frequency transform component that performs an inverse frequency domain transform of the filtered frequency transformed input signal.

33. The acoustic reverberation reduction system of claim 32, the frequency domain transform being a Modulated Complex Lapped Transform.

34. The acoustic reverberation reduction system of claim 32, the second adaptive filter further comprising a frequency domain transform component that performs a frequency domain transform of the input signal, filtering of the second adaptive filter being performed on the frequency transformed input signal, the second adaptive filter further comprising an inverse frequency transform component that performs an inverse frequency domain transform of the filtered frequency transformed input signal.

35. The acoustic reverberation reduction system of claim 34, the frequency domain transform of the second adaptive filter being a Modulated Complex Lapped Transform.

36. An acoustic reverberation reduction system, comprising:
a plurality of reverberation reduction channel components, at least some of the reverberation reduction channel components comprising a first adaptive filter comprising a frequency transform component that performs a frequency domain transform of an input signal of the channel, the first adaptive filter filtering the frequency transformed input signal based, at least in part, upon a plurality of adaptive coefficients, the first adaptive filter further comprising an inverse frequency transform component that performs an inverse frequency domain transform of the filtered frequency transformed input signal and provides an acoustic reverberation reduced output; a linear prediction analyzer that analyzes the input signal of the channel and provides a linear prediction residual output; a second adaptive filter comprising a frequency transform component that performs a frequency domain transform of the linear prediction residual output, the second adaptive filter filtering the linear prediction residual output based, at least in part, upon a plurality of adaptive coefficients, the second adaptive filter further comprising an inverse frequency transform component that performs an inverse frequency domain transformed of the filtered frequency transformed linear prediction residual output and provides an output; and a summing component that sums the plurality of outputs of the second adaptive filters; and, a feedback component that modifies at least one of the plurality of adaptive coefficients based, at least in part, upon a non-linear function of the output of summing component, the non-linear function being based, at least in part, upon the following equation:

$$J(n) = \frac{E\{\tilde{y}^4(n)\}}{E^2\{\tilde{y}^2(n)\}} - 3$$

where J(n) is the kurtosis metric.
y-tilda(n) is the output of the summing component, and
E{} are expectations.

37. The acoustic reverberation reduction system of claim 36, the non-linear function being based, at least in part, upon maximization of kurtosis.

38. The acoustic reverberation reduction system of claim 36, the frequency domain transform of at least one of the first adaptive filter and the second adaptive filter being a Modulated Complex Lapped Transform.

39. The acoustic reverberation reduction system of claim 36, data used to drive the second adaptive filter being stared in the system.

40. The acoustic reverberation reduction system of claim 39, the data used to drive the second adaptive filter not being synchronized with the input signal.

41. The acoustic reverberation reduction system of claim 36, the data used to drive the second adaptive filter being based, at least in part, upon the presence of voiced speech.

42. The acoustic reverberation reduction system of claim 36, a data rate of the first and second adaptive filters being different.

43. The acoustic reverberation reduction system of claim 36, the data on each channel corresponding to a signal from different microphones.

44. An acoustic signal enhancement system, comprising:
a voice activity noise detector that provides information to a noise buffer and a signal+noise buffer;
a filter that filters the input signal based, at least in part, upon a plurality of adaptive coefficients, the filter providing an acoustic enhanced signal output;
a noise adaptive filter that that filters information stored in the noise buffer based, at least in part, upon the plurality of adaptive coefficients, the noise reduction adaptive filter modifying at least one of the plurality of adaptive coefficients based, at least in part, upon a noise reduction feedback output, the noise reduction adaptive filter further providing an output;
a noise feedback component that provides the noise reduction feedback output based, at least in part, upon a weighted error calculation of the output of the noise reduction adaptive filter;
a reverberation reduction adaptive filter that filters at least a part of the speech signal based, at least in part, upon the plurality of adaptive coefficients, the reverberation reduction adaptive filter modifying at least one of the plurality of adaptive coefficients based, at least in part, upon a reverberation feedback output, the reverberation reduction adaptive filter further providing an output; and, a reverberation feedback component that provides the reverberation feedback output based, at least in part, upon a non-linear function of the output of the reverberation reduction adaptive filter, the non-linear function being based, at least in part, upon the following equation:

$$J(n) = \frac{E\{\tilde{y}^4(n)\}}{E^2\{\tilde{y}^2(n)\}} - 3$$

where J(n) is the kurtosis metric,
y-tilda(n) is the output of the reverberation reduction adaptive filter, and
E{} are expectations.

45. A method for reducing acoustic reverberation, comprising:
providing an acoustic reverberation reduced output based, at least in part, upon a plurality of adaptive coefficients;
modifying at least one of the plurality of adaptive coefficient based, at least in part, upon a feedback output; and,
providing the feedback output based, at least in part, upon a non-linear function of the acoustic reverberation reduced output, the non-linear function being based, at least in part, upon the following equation:

$$J(n) = \frac{E\{\tilde{y}^4(n)\}}{E^2\{\tilde{y}^2(n)\}} - 3$$

where J(n) is the kurtosis metric,
y-tilda(n) is the acoustic reverberation reduced output, and
E{} are expectations.

46. The method of claim 45, the non-linear function being based, at least in part, upon maximization of kurtosis.

47. A method for enhancing an acoustic signal, comprising:
storing noise information associated with a noise portion of an input signal;
storing signal+noise information with a signal and noise portion of the input signal;
filtering the input signal based, at least in part, upon a plurality of adaptive coefficients;
providing a noise adaptive filter output signal based, at least in part, upon the stored noise information and the plurality of adaptive coefficients;
modifying at least one of the plurality of adaptive coefficients based, at least in part, upon a noise feedback output;
providing the noise feedback output based, at least in part, upon a weighted error of the noise statistics and the signal+noise statistics;
providing a reverberation filter output based, at least in part, upon the stored signal−noise information and the plurality of adaptive coefficients;

modifying at least one of the plurality of adaptive coefficients based, at least in part, upon a reverberation feedback output; and,
providing the reverberation feedback output based, at least in part, upon a non-linear function of the output of the reverberation adaptive filter, the non-linear function being based, at least in part, upon the following equation:

$$J(n) = \frac{E\{\tilde{y}^4(n)\}}{E^2\{\tilde{y}^2(n)\}} - 3$$

where J(n) is the kurtosis metric,
y-tilda(n) is the output of the reverberation adaptive filter, and
E{} are expectations.

48. A computer readable medium storing computer executable components of a system facilitating acoustic reverberation reduction, comprising;
an adaptive filter component that filters a linear prediction output based, at least in part, upon a plurality of adaptive coefficients, the adaptive filter component modifying at least one of the plurality of adaptive coefficients based, at least in part, upon a feedback output the adaptive filter component providing an acoustic reverberation reduced output; and,
a feedback component that provides the feedback output based, at least in part, upon a non-linear function of the acoustic reverberation reduced output, the non-linear function being based, at least in part, upon the following equation:

$$J(n) = \frac{E\{\tilde{y}^4(n)\}}{E^2\{\tilde{y}^2(n)\}} - 3$$

where J(n) is the kurtosis metric,
y-tilda(n) is the acoustic reverberation reduced output, and
E{} are expectations.

49. An acoustic reverberation reduction system, comprising:
means for providing an acoustic reverberation reduced output based, at least in part, upon a plurality of adaptive coefficients;
means for modifying at least one of the plurality of adaptive coefficient based, at least in part, upon a feedback output; and,
means for providing the feedback output based, at least in part, upon a non-linear function of the acoustic reverberation reduced output, the non-linear function being based, at least in part, upon the following equation:

$$J(n) = \frac{E\{\tilde{y}^4(n)\}}{E^2\{\tilde{y}^2(n)\}} - 3$$

where J(n) is the kurtosis metric,
y-tilda(n) is the acoustic reverberation reduced output, and
E{} are expectations.

* * * * *